US012720802B2

(12) United States Patent
Kim et al.

(10) Patent No.: US 12,720,802 B2
(45) Date of Patent: Aug. 25, 2026

(54) SEMICONDUCTOR DEVICE

(71) Applicant: Samsung Electronics Co., Ltd., Suwon-si (KR)

(72) Inventors: Gukhee Kim, Suwon-si (KR); Kyoungwoo Lee, Suwon-si (KR); Sangcheol Na, Suwon-si (KR); Minchan Gwak, Suwon-si (KR); Youngwoo Kim, Suwon-si (KR); Hojun Kim, Suwon-si (KR); Dongick Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 283 days.

(21) Appl. No.: 18/382,616

(22) Filed: Oct. 23, 2023

(65) Prior Publication Data

US 2024/0145556 A1 May 2, 2024

(30) Foreign Application Priority Data

Nov. 1, 2022 (KR) ........................ 10-2022-0143607
May 12, 2023 (KR) ........................ 10-2023-0061806

(51) Int. Cl.
*H10W 20/41* (2026.01)
*H10D 30/43* (2025.01)
(Continued)

(52) U.S. Cl.
CPC ......... *H10D 30/6729* (2025.01); *H10D 30/43* (2025.01); *H10D 30/6735* (2025.01);
(Continued)

(58) Field of Classification Search
CPC .. H10D 30/501; H10D 30/502; H10D 30/506; H10D 30/6704; H10D 30/674;
(Continued)

(56) References Cited

U.S. PATENT DOCUMENTS 11,004,789 B2 * 5/2021 Doornbos .......... H10D 84/0193
11,121,086 B2 9/2021 Hiblot et al.
(Continued)

OTHER PUBLICATIONS

Youngwoo Kim et al., "Design and Experimental Validation of small Power Tap Cell scheme for sub-2 nm technology node", SRD e-Technical Journal 2022, 2nd Half (4 pages).
(Continued)

*Primary Examiner* — Caleen O Sullivan
*Assistant Examiner* — Brett Squires
(74) *Attorney, Agent, or Firm* — Muir Patent Law, PLLC

(57) ABSTRACT

A semiconductor device, comprising: first and second fin-type active patterns disposed on an upper surface of a substrate, and having different widths; first and second gate structures crossing the first and second fin-type active patterns, respectively; first and second source/drain regions disposed on the first and second fin-type active patterns, respectively; first and second contact structures connected to the first and second source/drain regions, respectively; a gate isolation structure adjacent to the first fin-type active pattern having a relatively large width; a buried conductive structure contacting one end surface of the gate isolation structure, and connected to the second contact structure; a conductive through-structure extending from a lower surface of the substrate, and connected to the buried conductive structure; and a first wiring layer electrically connected to the first contact structure and the buried conductive structure.

19 Claims, 19 Drawing Sheets

(51) Int. Cl.
*H10D 30/67* (2025.01)
*H10D 62/10* (2025.01)
*H10D 84/85* (2025.01)

(52) U.S. Cl.
CPC ........... *H10D 62/121* (2025.01); *H10D 84/85* (2025.01); *H10W 20/427* (2026.01)

(58) Field of Classification Search
CPC ........... H10D 30/6728; H10D 30/6729; H10D 30/6735; H10D 84/85; H10D 62/121; H10D 30/43; H10D 23/5286; H10W 20/427
See application file for complete search history.

(56) References Cited

U.S. PATENT DOCUMENTS

| | | | | |
|---|---|---|---|---|
| 11,355,487 | B2 | 6/2022 | Lai et al. | |
| 2020/0098681 | A1 | 3/2020 | Kim et al. | |
| 2021/0035967 | A1 | 2/2021 | Liebmann et al. | |
| 2021/0384351 | A1 | 12/2021 | Chen et al. | |
| 2022/0020859 | A1 | 1/2022 | Cho et al. | |
| 2022/0157722 | A1 | 5/2022 | Bouche et al. | |
| 2022/0157723 | A1 | 5/2022 | Park et al. | |
| 2022/0173039 | A1 | 6/2022 | Yang et al. | |
| 2023/0317566 | A1* | 10/2023 | Fan | H10D 62/364 |
| 2023/0420359 | A1* | 12/2023 | Xie | H10W 10/011 |

OTHER PUBLICATIONS

Extended European Search Report dated Apr. 2, 2024 for corresponding application No. EP 23207187.8.

* cited by examiner

SEMICONDUCTOR DEVICE

CROSS-REFERENCE TO RELATED APPLICATION(S)

This application claims benefit of priority to Korean Patent Application No. 10-2022-0143607, filed on Nov. 1, 2022, and Korean Patent Application No. 10-2023-0061806, filed on May 12, 2023, in the Korean Intellectual Property Office, the disclosures of both of which are incorporated herein by reference in their entireties.

BACKGROUND

The present inventive concept relates to a semiconductor device.

In various semiconductor devices such as a logic circuit and a memory, an active region such as a source and a drain is connected to a metal line of a back end of line (BEOL) through a contact structure. A solution for disposing at least some lines (for example, a power line) of the BEOL on a backside of a semiconductor substrate and forming a conductive through-structure configured to penetrate the semiconductor substrate in order to connect the lines is desired.

SUMMARY

An aspect of the present inventive concept is to provide a semiconductor device having a power delivery structure effectively arranged in a limited space.

According to an aspect of the present inventive concept, a semiconductor device comprises: a substrate having first and second surfaces opposite to each other; a first fin-type active pattern extending lengthwise in a first direction on the first surface of the substrate and having a first width in a second direction intersecting the first direction; a second fin-type active pattern spaced apart from the first fin-type active pattern in the first direction, extending lengthwise in the first direction on the first surface of the substrate, and having a second width in the second direction, the second width being smaller than the first width; a device isolation pattern disposed between the first and second fin-type active patterns; first and second gate structures extending in the second direction, and crossing the first and second fin-type active patterns, respectively; a first source/drain region disposed on the first fin-type active pattern on at least one side of the first gate structure; a second source/drain region disposed on the second fin-type active pattern on at least one side of the second gate structure; an interlayer insulating portion disposed on the first surface of the substrate, and covering the first and second source/drain regions; first and second contact structures connected to the first and second source/drain regions in the interlayer insulating portion, respectively; a gate isolation structure positioned adjacent to the first fin-type active pattern in the second direction in the interlayer insulating portion, and extending lengthwise in the first direction while contacting one end surface of the first gate structure; a buried conductive structure extending in the first direction while contacting one end surface of the gate isolation structure in the interlayer insulating portion, and connected to the second contact structure; a conductive through-structure extending from the second surface of the substrate toward the first surface of the substrate, and connected to the buried conductive structure; and a first wiring structure disposed on the interlayer insulating portion, and having a first wiring layer electrically connected to the first contact structure and the buried conductive structure.

According to an aspect of the present inventive concept, a semiconductor device comprises: a substrate having a first surface having a first cell region and a second cell region arranged in a first direction, and a second surface opposite to the first surface; a first fin-type active pattern extending lengthwise in a first direction in the first cell region of the substrate and having a first width in a second direction intersecting the first direction; a second fin-type active pattern overlapping the first fin-type active pattern in the first direction in the second cell region of the substrate, extending lengthwise in the first direction, and having a second width in the second direction, the second width being smaller than the first width; a device isolation pattern disposed between the first and second fin-type active patterns along a boundary between the first and second cell regions; first and second gate structures disposed in the first and second cell regions, respectively, and extending lengthwise in the second direction to cross the first and second fin-type active patterns, respectively; a first source/drain region disposed on the first fin-type active pattern on at least one side of the first gate structure; a second source/drain region disposed on the second fin-type active pattern on at least one side of the second gate structure; first and second contact structures connected to the first and second source/drain regions, respectively, and extending in a direction perpendicular to the first surface of the substrate; a gate isolation structure positioned at a boundary of the first cell region adjacent to the first fin-type active pattern in the second direction, and extending in the first direction while contacting one end surface of the first gate structure; a buried conductive structure positioned at a boundary of the second cell region adjacent to the second fin-type active pattern in the second direction, extending in the first direction while contacting one end surface of the gate isolation structure, and connected to the second contact structure; a conductive through-structure extending from the second surface of the substrate toward the first surface of the substrate, and connected to the buried conductive structure; a first wiring structure having a first wiring layer connecting the first contact structure and the buried conductive structure; and a second wiring structure disposed on the second surface of the substrate, and having a second wiring layer connected to the conductive through-structure;

According to an aspect of the present inventive concept, a semiconductor device comprises: a substrate having first and second surfaces opposite to each other; a fin-type active pattern extending lengthwise in a first direction on the first surface of the substrate, and comprising a first fin portion having a first width in a second direction intersecting the first direction and a second fin portion having a second width in the second direction, the second width being smaller than the first width; first and second gate structures extending lengthwise in a second direction intersecting the first direction, and crossing the first fin portion and the second fin portion, respectively; a gate isolation structure positioned adjacent to the fin-type active pattern in the second direction, and extending in the first direction to isolate each of the first and second gate structures; a first source/drain region disposed on the first fin portion on at least one side of the first gate structure; a second source/drain region disposed on the second fin portion on at least one side of the second gate structure; an interlayer insulating portion disposed on the first surface of the substrate, and covering the first and second source/drain regions; first and second contact structures penetrating the interlayer insulating portion, and connected to the first and second source/drain regions, respectively; a buried conductive structure disposed in a region where at least a portion of the gate isolation structure adjacent to the first fin portion is removed, and connected to the second contact structure; a conductive through-structure extending from the second surface of the substrate toward the first surface of the substrate, and connected to the buried conductive structure; and a first wiring structure disposed on the interlayer insulating portion, and having a first wiring layer connected to the first contact structure and the buried conductive structure.

According to an aspect of the present inventive concept, a semiconductor device comprises: a first fin-type active pattern extending lengthwise in a first direction, and having a first width in a second direction intersecting the first direction; a second fin-type active pattern spaced apart from the first fin-type active pattern in the first direction, extending lengthwise in the first direction, and having a second width in the second direction, the second width being smaller than the first width; a device isolation pattern disposed between the first and second fin-type active patterns, and extending in the second direction; first and second gate structures each extending lengthwise in the second direction, and crossing the first and second fin-type active patterns, respectively; a first source/drain region disposed on the first fin-type active pattern on at least one side of the first gate structure; a second source/drain region disposed on the second fin-type active pattern on at least one side of the second gate structure; an interlayer insulating portion surrounding the first and second fin-type active patterns, and covering the first and second gate structures and the first and second source/drain regions; first and second contact structures connected to the first and second source/drain regions in the interlayer insulating portion, respectively; a gate isolation structure positioned adjacent to the first fin-type active pattern in the second direction in the interlayer insulating portion, and extending in the first direction while contacting one end surface of the first gate structure; a buried conductive structure extending in the first direction while contacting one end surface of the gate isolation structure in the interlayer insulating portion, and connected to the second contact structure; a first wiring structure disposed on the interlayer insulating portion, and having a first wiring layer electrically connected to the first contact structure and the buried conductive structure; and a second wiring structure disposed on a lower surface of the interlayer insulating portion, and having a power delivery structure connected to the buried conductive structure and a second wiring layer connected to the power delivery structure.

The various beneficial advantages and effects of the present inventive concept are not limited to the above, and will be more easily understood in the process of describing specific embodiments of the present inventive concept.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, various embodiments of the present inventive concept will be described with reference to the accompanying drawings. Like numbers/labels refer to like elements throughout.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Ordinal numbers such as "first," "second," "third," etc. may be used simply as labels of certain elements to distinguish such elements from one another. Terms that are not described using "first," "second," "third," etc. in the specification, may still be referred to as "first" or "second" or "third" in a claim. In addition, a term that is referenced with a particular ordinal number (e.g., "first" in a particular claim) may be described elsewhere with a different ordinal number (e.g., "second" in the specification or another claim).

Figure 1A:
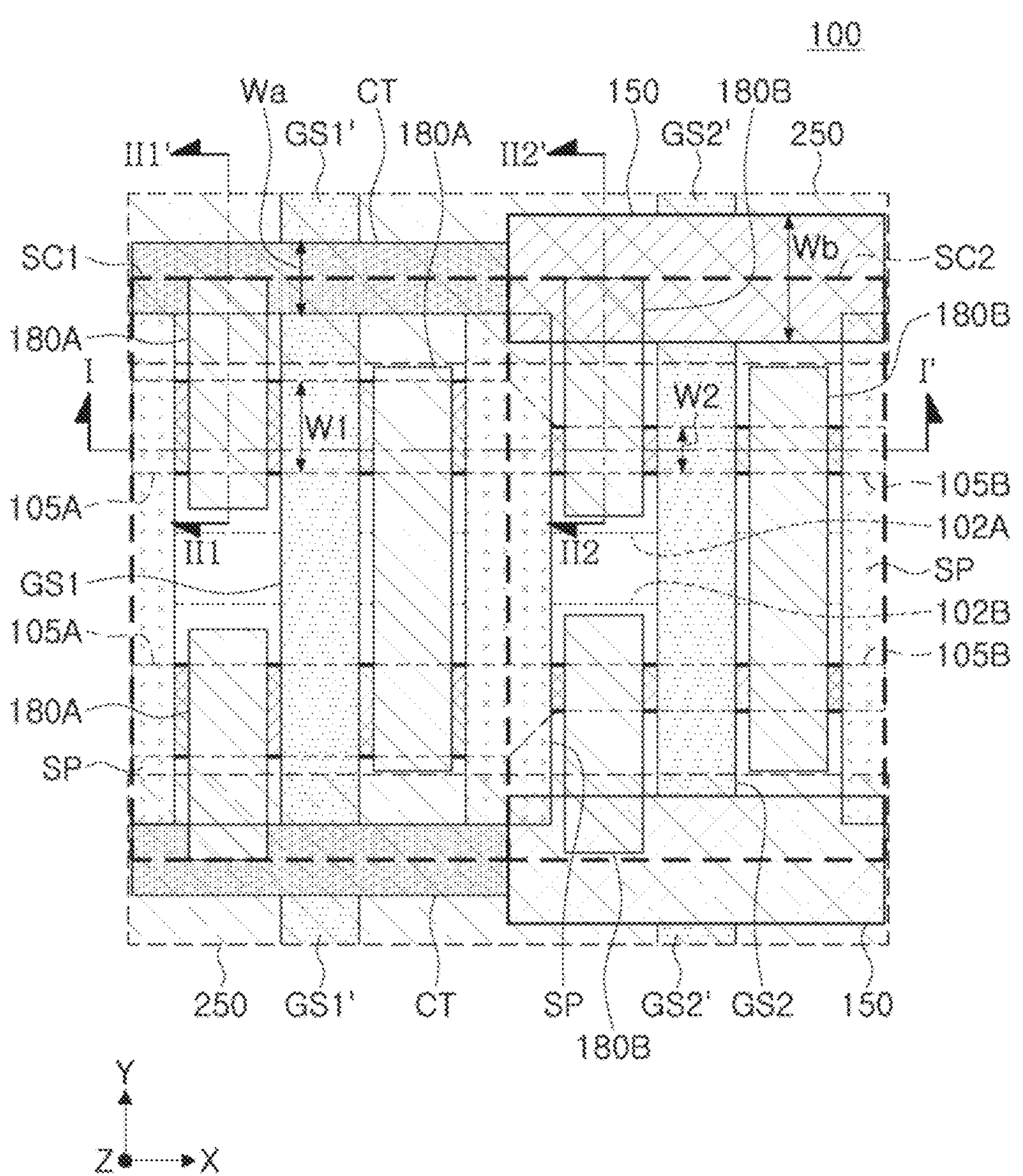
FIGS. 1A and 1B are plan views illustrating a semiconductor device according to an example embodiment of the present inventive concept.
Figure 1B:
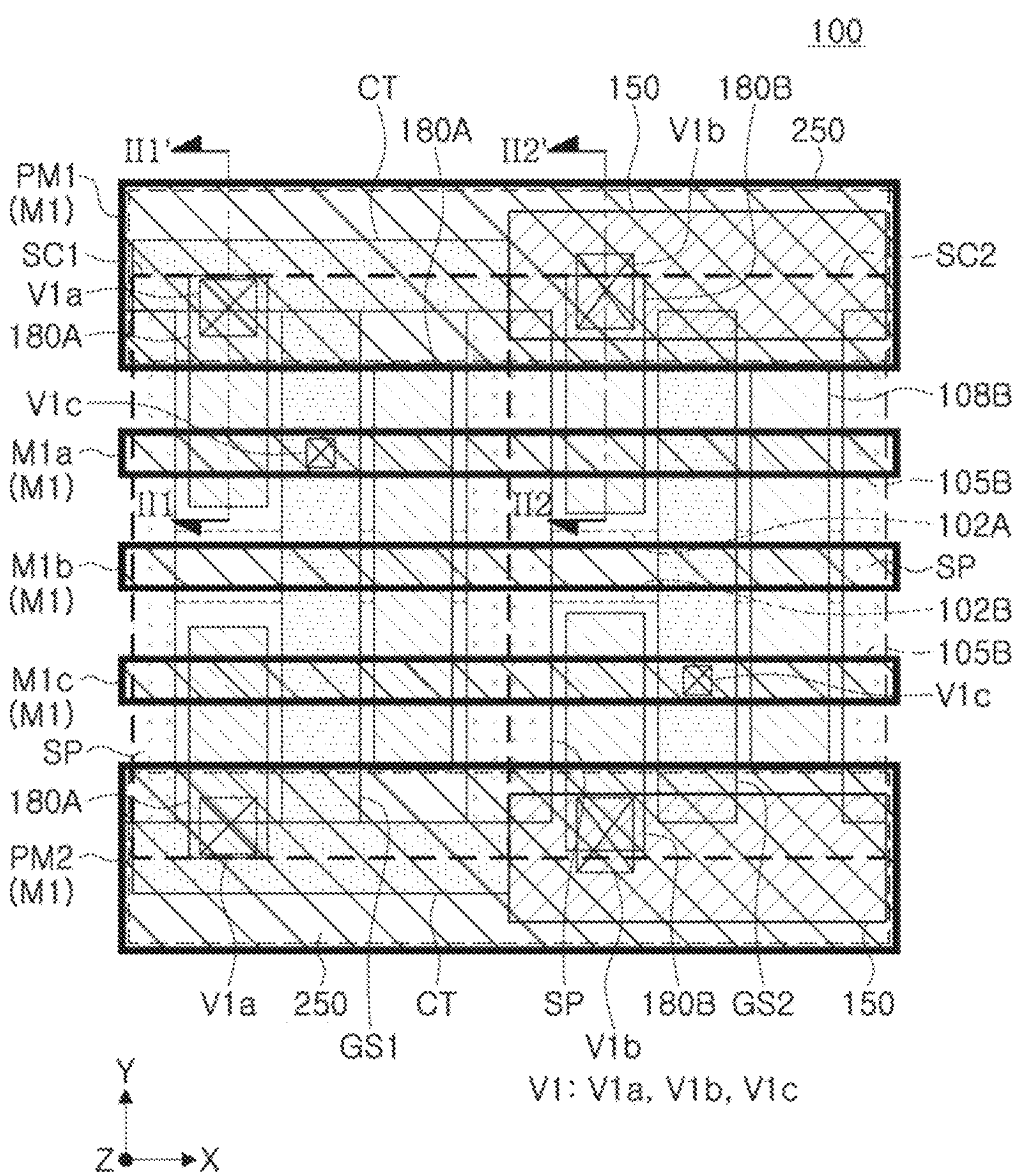
Figure 2:
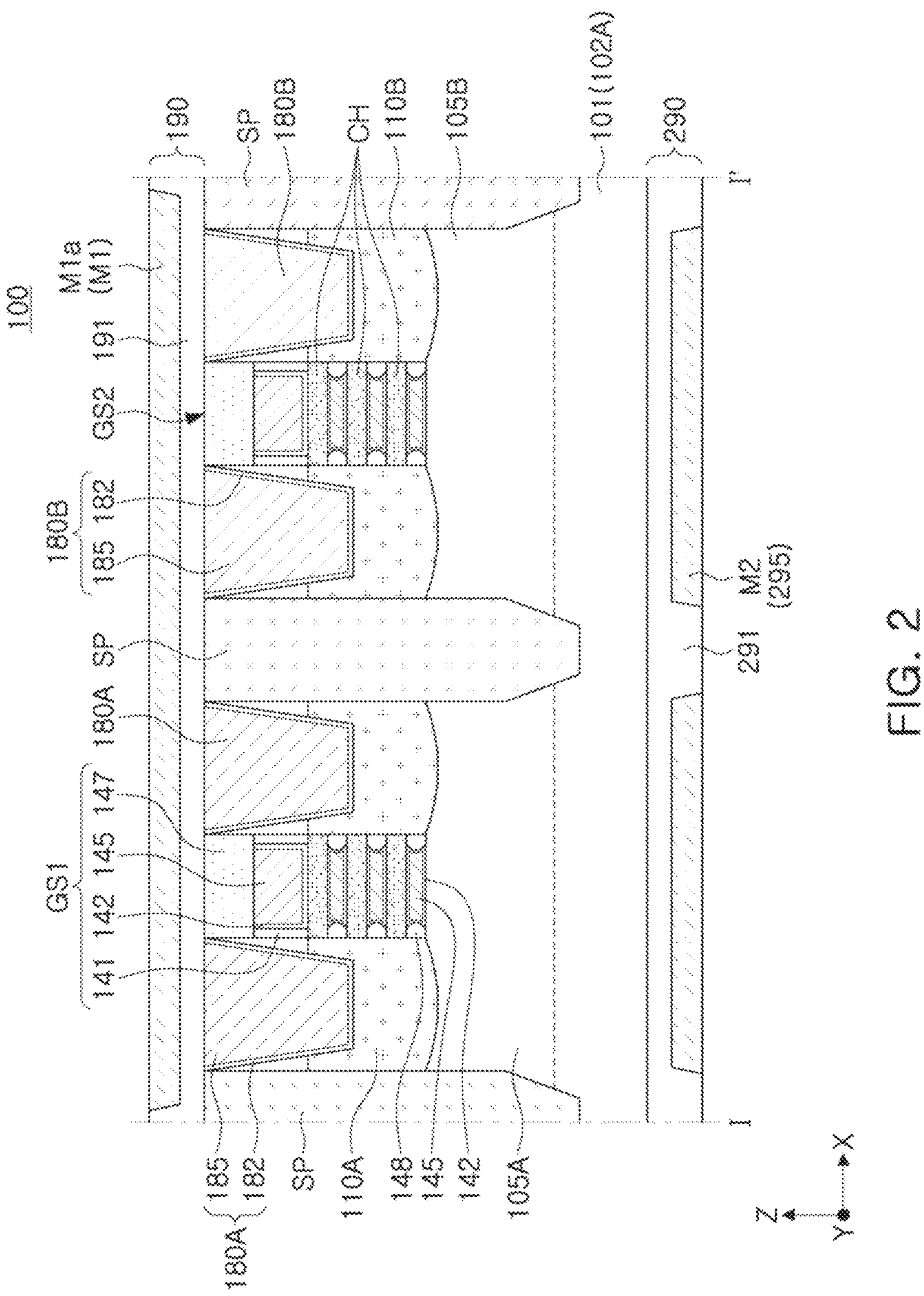
FIG. 2 is a cross-sectional view of the semiconductor device of FIG. 1 taken along line I-I'.
Figure 3A:
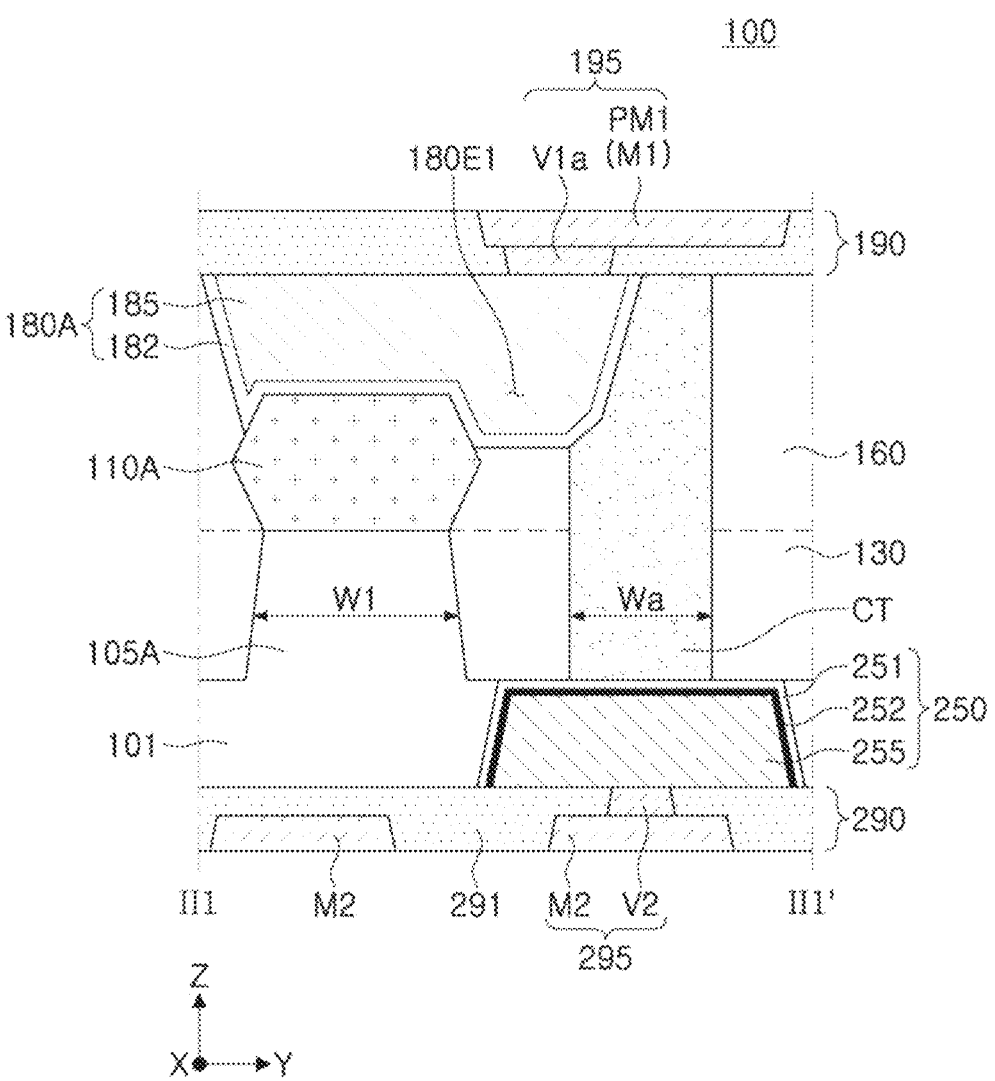
FIGS. 3A and 3B are cross-sectional views of the semiconductor device of FIGS. 1A and 1B taken along lines II1-II1' and II2-II2'.
Figure 3B:
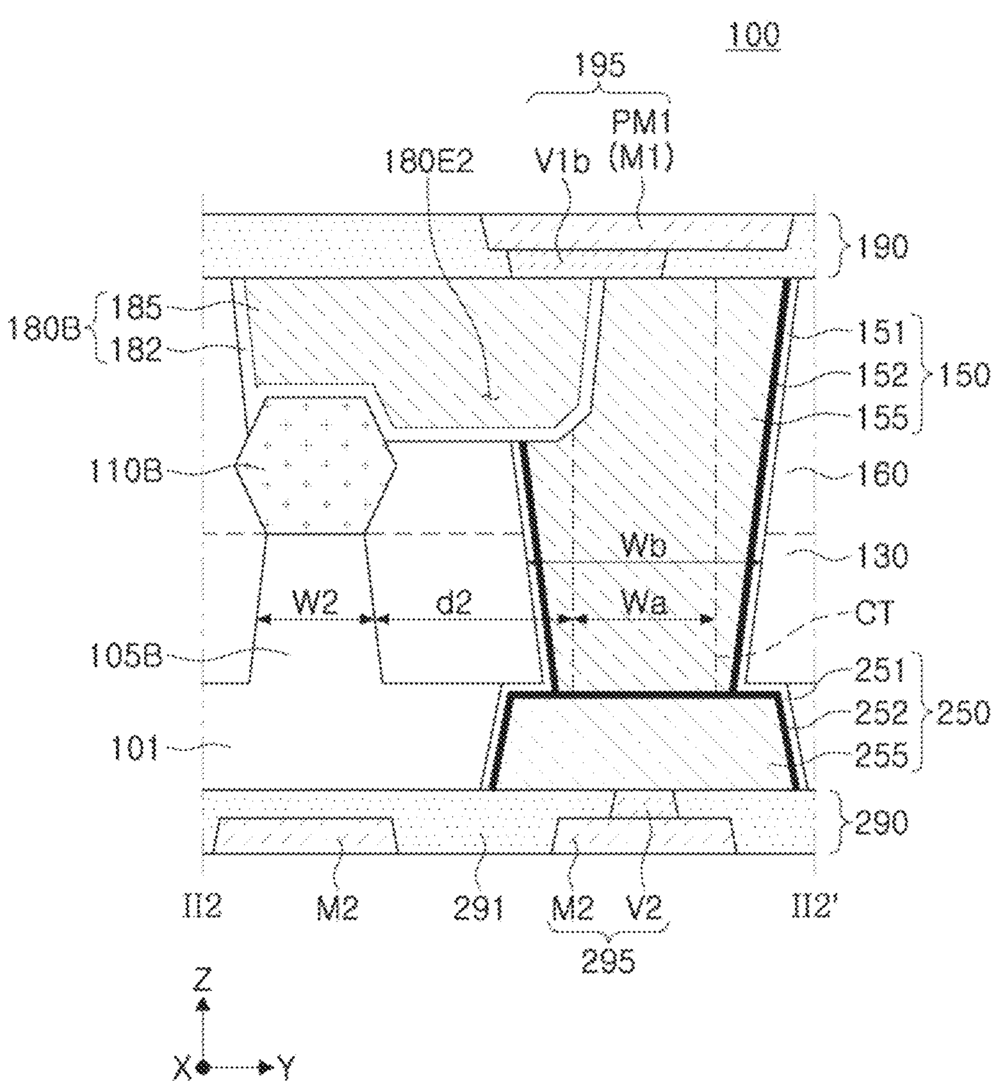

FIGS. 1A and 1B are plan views illustrating a semiconductor device according to an example embodiment of the present inventive concept, FIG. 2 is a cross-sectional view of the semiconductor device of FIG. 1 taken along line I-I', and FIGS. 3A and 3B are cross-sectional views of the semiconductor device of FIGS. 1A and 1B taken along lines II1-II1' and II2-II2'.

Referring to FIGS. 1A, 1B, 2, 3A and 3B, a semiconductor device 100 according to an embodiment of the present inventive concept may be divided into a first cell region SC1 and a second cell region SC2 arranged in a first direction (e.g., an X-direction).

The semiconductor device 100 may include a substrate 101 having a first surface (or an upper surface) and a second surface (or a lower surface) opposite to each other, a first fin-type active pattern 105A extending lengthwise in the first direction (e.g., the X-direction) in the first cell region SC1 of the substrate 101, and having a first width W1, a second fin-type active pattern 105B extending lengthwise in the first direction (e.g., the X-direction) in the second cell region SC2 of the substrate 101, and having a second width W2 smaller than the first width W1, and a device isolation pattern SP disposed between the first and second fin-type active patterns 105A and 105B along a boundary between the first and second cell regions SC1 and SC2. The second fin-type active pattern 105B may be arranged to overlap the first fin-type active pattern 105A in the first direction (e.g., the X-direction). The first and second fin-type active patterns 105A and 105B may be understood as the structures obtained by separating a single fin-type active pattern having two fin portions with different widths W1 and W2 with the device isolation pattern SP. The first and second widths W1 and W2 may be the maximum widths of the first and second fin-type active patterns 105A and 105B, respectively. The first and second fin-type active patterns 105A and 105B may be formed to extend above the upper surface (e.g., the first surface) of the substrate 101. For example, the first and second fin-type active patterns 105A and 105B may be described as protruding with respect to the upper surface of the substrate 101. In some embodiments, the first and second fin-type active patterns 105A and 105B may be part of the substrate 101 (e.g., formed by etching the substrate 101) or may be formed on the substrate 101 (e.g., an epitaxial layer grown from the substrate 101).

As shown in FIG. 1A, the device isolation pattern SP may extend lengthwise in a second direction (e.g., a Y-direction) between the first and second fin-type active patterns 105A and 105B, and may isolate the plurality of fin-type active patterns adjacent in the second direction. In addition, as shown in FIG. 2, the device isolation pattern SP may include an insulating material filled in a trench extending to a partial region of the substrate 101 between the first and second fin-type active patterns 105A and 105B. For example, a lower surface of the device isolation pattern SP may be at a lower level than an upper surface of the substrate 101.

The semiconductor device 100 according to the present embodiment may include first and second gate structures GS1 and GS2 extending lengthwise in the second direction (e.g., the Y-direction) intersecting the first direction (e.g., the X-direction), and crossing the first and second fin-type active patterns 105A and 105B, respectively. In addition, the semiconductor device 100 according to the present embodiment may include a first source/drain region 110A disposed on the first fin-type active pattern 105A on both sides of the first gate structure GS1, a second source/drain regions 110B disposed on the second fin-type active pattern 105B on both sides of the second gate structure GS2, and first and second contact structures 180A and 180B connected to the first and second source/drain regions 110A and 110B, respectively, and extending in a third direction (e.g., a Z-direction) perpendicular to the first surface of the substrate 101.

The substrate 101 may include, for example, a semiconductor such as Si or Ge or a compound semiconductor such as SiGe, SiC, GaAs, InAs, or InP. In another example, the substrate 101 may have a silicon on insulator (SOI) structure. The first surface of the substrate 101 may be provided with active regions 102A and 102B, and the active regions 102A and 102B may be conductive regions such as wells doped with impurities or structures doped with impurities. In the present embodiment, the active regions 102A and 102B may be an N-type well for a P-MOS transistor and a P-type well for an N-MOS transistor, respectively, but is not limited thereto.

A device isolation layer 130 may be formed on the first surface of the substrate 101 to surround the first and second fin-type active patterns 105A and 105B. Portions of the first and second fin-type active patterns 105A and 105B may protrude from an upper surface of the device isolation layer 130. In example embodiments, the upper surfaces of the first and second fin-type active patterns 105A and 105B may be coplanar with an upper surface of the device isolation layer 130. For example, the upper surfaces of the first and second fin-type active patterns 105A and 105B may be exposed by the device isolation layer 130. For example, the device isolation layer 130 may include a silicon oxide or a silicon oxide-based insulating material. The device isolation layer 130 may be divided into a first device isolation layer defining the first and second active regions 102A and 102B and a second device isolation layer defining the first and second fin-type active patterns 105A and 105B. The first device isolation layer may have a bottom surface deeper than a bottom surface of the second device isolation layer. For example, the first device isolation layer may also be referred to as a deep trench isolation (DTI), and the second device isolation layer may also be referred to as a shallow trench isolation (STI).

Referring to FIGS. 1A, 1B and 2, each of the first and second fin-type active patterns 105A and 105B may extend lengthwise in the first direction (e.g., the X-direction) on the first surface of the substrate 101. A plurality of semiconductor patterns CH may be disposed on each of the first and second fin-type active patterns 105A and 105B, respectively, and be spaced apart from each other in a third direction (e.g., a Z-direction) perpendicular to the first surface of the substrate 101. The fin-type active patterns 105A and 105B and the plurality of semiconductor patterns CH may be provided as a multi-channel layer of a transistor. In the present embodiment, the plurality of semiconductor patterns CH is exemplified as three, but the number thereof is not particularly limited. For example, the semiconductor patterns CH may include at least one of silicon (Si), silicon germanium (SiGe) and germanium (Ge).

As shown in FIG. 2, the first and second gate structures GS1 and GS2 employed in the present embodiment may include gate spacers 141, a gate insulating layer 142 and a gate electrode 145 sequentially disposed between the gate spacers 141, and a gate capping layer 147 disposed on the gate electrode 145. For example, the gate spacers 141 may include an insulating material such as silicon nitride (SiN), silicon oxynitride (SiON), silicon carbonitride (SiCN) or silicon oxycarbonitride (SiOCN). The gate insulating layer 142 may be formed of, for example, a silicon oxide layer, a high-κ dielectric layer, or a combination thereof. The high-κ dielectric layer may include a material having a permittivity (e.g., about 10 to 25) higher than that of the silicon oxide layer. For example, the high-κ dielectric layer may include a material selected from a hafnium oxide, a hafnium oxynitride, a hafnium silicon oxide, a lanthanum oxide, a lanthanum aluminum oxide, and a combination thereof, but is not limited thereto. The gate electrode 145 may include a conductive material, and for example, may include a metal nitride such as titanium nitride (TiN), tantalum nitride (TaN) or tungsten nitride (WN), a metal material such as aluminum (Al), tungsten (W) or molybdenum (Mo), and/or a semiconductor material such as a doped polysilicon. In some embodiments, the gate electrode 145 may be a multilayer including two or more layers. In addition, the gate capping layer 147 may include, for example, a silicon nitride, a silicon oxynitride, a silicon carbonitride, or a silicon oxycarbonitride.

As described above, the first and second source/drain regions 110A and 110B may be disposed on regions of the fin-type active patterns 105A and 105B at both sides of the first and second gate structures GS1 and GS2, respectively. The first and second source/drain regions 110A and 110B may be connected to both ends of the plurality of semiconductor patterns CH in the first direction (e.g., the X-direction), respectively. The gate electrode 145 may extend in a second direction (e.g., a Y-direction) across the first and second fin-type active patterns 105A and 105B while surrounding the plurality of semiconductor patterns CH. The gate electrodes 145 may be interposed between the plurality of semiconductor patterns CH as well as spaces between the gate spacers 141. Internal spacers 148 provided between the respective first and second source/drain regions 110A and 110B and the respective gate electrodes 145 may be included. The internal spacers 148 may be provided on both sides of portions of the gate electrodes 145 along the first direction (e.g., the X-direction), which are interposed between the plurality of semiconductor patterns CH. The plurality of semiconductor patterns CH may be connected to the source/drain regions 110 on both sides thereof, respectively, and portions of the gate electrodes 145 positioned between the plurality of semiconductor patterns CH may be electrically insulated from the first and second source/drain regions 110 by the internal spacers 148. The gate insulating layer 142 may be disposed between the respective gate electrode 145 and the respective semiconductor pattern CH, and may also extend between the gate electrode 145 and the internal spacers 148. As such, the semiconductor device 100 according to the present embodiment may constitute a gate-all-around type field effect transistor.

The first and second source/drain regions 110A and 110B may include an epitaxial pattern subjected to selective epitaxial growth (SEG) using, as a seed, recessed surfaces (including side surfaces of the of the plurality of semiconductor patterns CH) of the first and second fin-type active patterns 105A and 105B at both sides of the gate structure GS. These first and second source/drain regions 110A and 110B may be also referred to as a raised source/drain (RSD). For example, the first and second source/drain regions 110A and 110B may be made of Si, SiGe, or Ge, and may have either N-type or P-type conductivity. In the case of forming a P-type source/drain region, it may be re-grown with SiGe, and doped with P-type impurities, for example, boron (B), indium (In), gallium (Ga), boron trifluoride (BF3), etc. In the case of forming an N-type source/drain region using silicon (Si), it may be doped with N-type impurities, for example, phosphorus (P), nitrogen (N), arsenic (As), antimony (Sb), etc. It may have different shapes along the crystallographically stable faces during the growth process. For example, as shown in FIGS. 3A and 3B, the first and second source/drain regions 110A and 110B may have a pentagonal cross section (in the case of a P-type impurity), but otherwise, may have a hexagonal cross section or a polygonal cross section having a gentle angle (in the case of an N-type impurity).

The semiconductor device 100 according to the present embodiment may include an interlayer insulating layer 160 disposed on the device isolation layer 130. The interlayer insulating layer 160 may be disposed around the first and second gate structures GS1 and GS2 while partially covering the first and second source/drain regions 110A and 110B. For example, the interlayer insulating layer 160 may contact portions of the first and second gate structures GS1 and GS2 and portions of the first and second source/drain regions 110A and 110B. For example, the interlayer insulating layer 160 may include flowable oxide (FOX), tonen silazen (TOSZ), undoped silica glass (USG), borosilica glass (BSG), phosphosilaca glass (PSG), borophosphosilica glass (BPSG), plasma enhanced tetra ethyl ortho silicate (PETEOS), fluoride silicate glass (FSG), high density plasma (HDP) oxide, plasma enhanced oxide (PEOX), or flowable CVD (FCVD) oxide, or a combination thereof. The interlayer insulating layer 160 may be formed using a chemical vapor deposition (CVD) process, a flowable-CVD process, or a spin coating process. In this specification, the term "interlayer insulating portion" refers to an insulating portion including the interlayer insulating layer 160 and the device element isolation layer 130.

The first and second contact structures 180A and 180B may penetrate the interlayer insulating layer 160 and be connected to the first and second source/drain regions 110A and 110B, respectively. For example, the first and second contact structures 180A and 180B may contact the first and second source/drain regions 110A and 110B, respectively. The first and second contact structures 180A and 180B may interconnect the first and second source/drain regions 110A and 110B and the first wiring structure 190. The first and second contact structures 180A and 180B may include a conductive barrier 182 and a contact plug (or a conductive material) 185. The conductive barrier 182 may contact lower and side surfaces of the contact plug 185. Upper surfaces of the conductive barrier 182 and the contact plug 185 may be coplanar with an upper surface of the interlayer insulating layer 160.

A power delivery network employed in the present embodiment may include a buried conductive structure 150 connected to the second source/drain region 110B in the interlayer insulating portion 130 and 160, a conductive through-structure 250 penetrating the substrate 101 from the second surface of the substrate 101 and connected to the buried conductive structure 150, and a second wiring structure 290 disposed on the second surface of the substrate 101 and connected to the conductive through-structure 250. In the present embodiment, the power delivery network may further include a first wiring structure 190 disposed on the interlayer insulating layer 160 and connecting the buried conductive structure 150 of the second cell region SC2 and the first contact structure 180A of the first cell region SC1.

Referring to FIGS. 1A and 3A, in the first cell region SC1, the first gate structures GS1 and GS1' may be isolated by a gate isolation structure CT. End surfaces of the isolated first gate structures GS1 and GS1' may contact both side surfaces of the gate isolation structure CT, respectively. The gate isolation structure CT may extend lengthwise in the first direction (e.g., the X-direction) along a boundary of the first cell region SC1 adjacent to the first fin-type active pattern 105A. In the present embodiment, the gate isolation structure CT may be disposed on upper and lower boundaries defining a height of the first cell region SC1, respectively.

The gate isolation structure CT may be formed to extend to the second cell region SC2 to isolate the second gate structures GS2 and GS2' However, in a subsequent process, at least a portion of the gate isolation structure CT positioned in the second cell region SC2 may be removed, and a buried conductive structure 150 may be formed in the removed region.

In the present embodiment, it may be understood that a portion of the gate isolation structure CT positioned in the second cell region SC2 is replaced with the buried conductive structure 150. Specifically, as shown in FIGS. 1A, 1B and 3B, in the second cell region SC2, the buried conductive structure 150 may be connected to the gate isolation structure CT and extend lengthwise in the first direction (e.g., the X-direction).

In the present embodiment, the buried conductive structure 150 may be formed in the gate isolation structure CT, which is an inactive area, and may be selectively disposed in a region adjacent to the second fin-type active pattern 105B having a relatively narrow second width W2. Since a space of the second cell region SC2, in which the second fin-type active pattern 105B having the relatively narrow second width W2 is disposed, is wider than a space of the first cell region SC1, in which the first fin-type active pattern 105A having a relatively wide first width W1 is disposed, the second cell region SC2 may provide more favorable conditions for forming the buried conductive structure 150 than the first cell region SC1.

In the second cell region SC2, the buried conductive structure 150 may be formed to have a width Wb greater than a width Wa of the gate isolation structure CT. As a result, it is possible to contact the conductive through-structure 250 with a relatively large area, whereby contact resistance between the buried conductive structure 150 and the conductive through-structure 250 can be improved.

As shown in FIG. 3B, the conductive through-structure 250 may extend from the second surface of the substrate 101 toward the first surface thereof and connected to the buried conductive structure 150 so as to configure a desired power delivery network. As shown in FIGS. 1A and 1B, the conductive through-structure 250 may extend in a first direction (e.g., the X-direction). In the present embodiment, the conductive through-structure 250 may be connected to a lower surface of the gate isolation structure CT in the first cell area SC1 (see FIG. 3A), and may contact the buried conductive structure 150 in the second cell area SC2 (see FIG. 3B).

In the present embodiment, as shown in FIG. 3B, the conductive through-structure 250 may contact the buried conductive structure 150 on the first surface of the substrate 101. In other embodiments, a contact location of the conductive through-structure 250 and the buried conductive structure 150 may be variously changed within the device isolation layer 130 or within the substrate 101.

The semiconductor device 100 according to the present embodiment may supply power to the first cell region SC1 as well as the second cell region SC2 through the buried conductive structure 150 adjacent to the second fin-type active pattern 105B in the second cell region SC2. FIG. 1B illustrates a plane in which first metal lines M1 and first metal vias V1 of the first wiring structure (e.g., first wiring structure 190 in FIGS. 2, 3A, and 3B) are arranged in the layout of FIG. 1A.

Referring to FIG. 3B together with FIG. 1B, the buried conductive structure 150 may be directly connected to the second contact structure 180B disposed in the second source/drain region 110B. For example, the buried conductive structure 150 may contact the second contact structure 180B disposed in the second source/drain region 110B. The second contact structure 180B may have an extension portion 180E2 extending in the second direction (e.g., the Y-direction). The second contact structure 180B may be connected to the buried conductive structure 150 by the extension portion 180E2. Desired power (e.g., drain voltage VDD or source voltage VSS) may be supplied to the second cell region SC2 through this connection.

Meanwhile, in the semiconductor device 100 according to the present embodiment, the buried conductive structure 150 may supply power to the first fin-type active pattern 105A (in particular, the first source/drain region 110A) positioned in the first cell region SC1 through the first wiring structure 190.

Specifically, referring to FIGS. 1B, 3A, and 3B, the first wiring layer 195 may include a first metal line M1 (in particular, a power line PM1 or PM2) extending lengthwise in the first direction (e.g., the X-direction), and a second metal via V1*b* electrically connecting the first metal line M1 (in particular, a power line PM1 or PM2) and the buried conductive structure 150. The second metal via V1*b* may be connected to at least one of the buried conductive structure 150 and the extension portion 180E2 of the second contact structure 180B. In the present embodiment, the second metal via V1*b* may be connected to both the buried conductive structure 150 and the extension portion 180E2 of the second contact structure 180B. The first metal line M1 (in particular, the power line PM1 or PM2) may extend in the first direction (e.g., the X-direction) and be formed across the first and second cell regions SC1 and SC2.

Referring to FIG. 3A, the first contact structure 180A may have an extension portion 180E1 extending in the second direction (e.g., the Y-direction) similarly to the second contact structure 180B. The extension portion 180E1 of the first contact structure 180A may overlap the first metal line M1 (in particular, a power line PM1 or PM2) in a vertical direction (e.g., the Z-direction). In the present embodiment, the extension portion 180E1 of the first contact structure 180A may have a portion overlapping a portion of the gate isolation structure CT. In the first cell region SC1, the first metal line M1 may be connected to the extension portion 180E1 of the first contact structure 180A by a first metal via V1*a*. The buried conductive structure 150 may supply power (e.g., source voltage VSS or drain voltage VDD) to the first source/drain region 110A positioned in the first cell region SC1 through the connection structure of the first wiring layer 195.

In the present embodiment, the power delivery structure (e.g., the buried conductive structure 150 and the conductive through-structure 250) may be configured to be formed on the upper and lower boundaries of the first and second cell regions SC1 and SC2, respectively, and supply power (e.g., drain voltage VDD and source voltage VSS) to the active regions of the first and second cell regions SC1 and SC2.

As shown in FIG. 1B, the first metal line M1 may include first and second power lines PM1 and PM2 disposed on the upper and lower boundaries, respectively, and signal lines M1*a*, M1*b* and M1*c* therebetween. As described above, each of the first and second power lines PM1 and PM2 may be configured to connect the buried conductive structure 150 of the second cell area SC2 and the second contact structure 180B of the first cell area SC1 each other. The signal lines M1*a*, M1*b*, and M1*c* may be connected to the gate structures GS1 and GS2 and/or the source/drain regions 110A and 110B through the metal via V1*c* in the first and second cell regions SC1 and SC2. In some embodiments, widths in the second direction (e.g., the Y-direction) of the first and second power lines PM1 and PM2 may be greater than widths in the second direction of the signal lines M1*a*, M1*b*, and M1*c*.

In the present embodiment, the buried conductive structure 150 may include a first contact plug 155 and a first conductive barrier 152 disposed on a side surface and a bottom surface of the first contact plug 155. The first conductive barrier 152 may contact the side and bottom surfaces of the first contact plug 155. In some embodiments, the buried conductive structure 150 may further include a first insulating liner 151 positioned on a portion of the first conductive barrier 152 surrounding the side surface of the first contact plug 155. In example embodiments, the first insulating liner 151 may contact the first conductive barrier 152.

The conductive through-structure 250 may have a trench structure extending in the first direction (e.g., the X-direction) while penetrating the substrate 101, and may include a second contact plug 255, a second conductive barrier 252 disposed on a side surface and an upper surface of the second contact plug 255, and a second insulating liner 251 disposed between the second conductive barrier 252 and the substrate 101. The second conductive barrier 252 may contact the side and bottom surfaces of the second contact plug 255.

For example, at least one of the first conductive barrier 152 and the second conductive barrier 252 may include Ta, TaN, Mn, MnN, WN, Ti, TiN, or a combination thereof. In the present embodiment, the first conductive barrier 152 and the second conductive barrier 252 may include different conductive materials. In some embodiments, the first conductive barrier 152 may include TiN. The second conductive barrier 252 may include TaN or Co/TaN.

For example, at least one of the first contact plug 155 and the second contact plug 255 may include Cu, Co, Mo, Ru, W, or an alloy thereof. In the present embodiment, the first contact plug 155 and the second contact plug 255 may include different conductive materials. In some embodiments, the first contact plug 155 may include Mo. The second conductive barrier 252 may include Cu or W. For example, at least one of the first insulating liner 151 and the second insulating liner 251 may include, for example, $SiO_2$, SiN, SiCN, SiC, SiCOH, SiON, $Al_2O_3$, AN, or a combination thereof.

The first wiring structure 190 may include a plurality of first insulating layers 191 and a first wiring layer 195 disposed on the plurality of first insulating layers 191. The first wiring layer 195 may include a metal line M1 and a metal via V1. The metal line M1 may be disposed on the first insulating layer 191 and the metal via V1 may penetrate the first insulating layer 191. As described above, the metal via V1 may include the first metal via V1*a* connecting the metal line M1 (in particular, a power line PM1 or PM2) and the first contact structure 180A, and the second metal via V1*b* connecting the metal line M1 (in particular, a power line PM1 or PM2) and the buried conductive structure 150 (see FIG. 1B). For example, the first insulating layer 191 may include a silicon oxide, a silicon oxynitride, SiOC, SiCOH, or a combination thereof. For example, the metal line M1 and the metal via V1 may include copper or a copper-containing alloy. In some embodiments, the metal line M1 and the metal via V1 may be formed together using a dual-damascene process.

An etch stop layer (not shown) may be disposed on the second surface of the substrate 101, and the second wiring structure 290 connected to the conductive through-structure 250 may be disposed on the etch stop layer. Similar to the first wiring structure 190, the second wiring structure 290 may include a plurality of second insulating layers 291 and a second wiring layer 295 disposed on the plurality of second insulating layers 291. Similar to the first wiring layer 195, the second wiring layer 295 may include a metal line M2 and a metal via V2.

In the present embodiment, the second wiring layer 295 of the second wiring structure 290 may include a wiring layer for power delivery, and the first wiring layer 195 of the first wiring structure 190 may include a wiring layer for signal transmission. Power is supplied to the second contact structure 180B of the second cell region SC2 through the second wiring layer 295, the conductive through-structure 250 and the buried conductive structure 150 positioned on the second surface of the substrate 101, and may also be supplied to the first contact structure 180A of the first cell region SC1 through the first wiring layer 195 connected to the buried conductive structure 150.

Figure 4A:
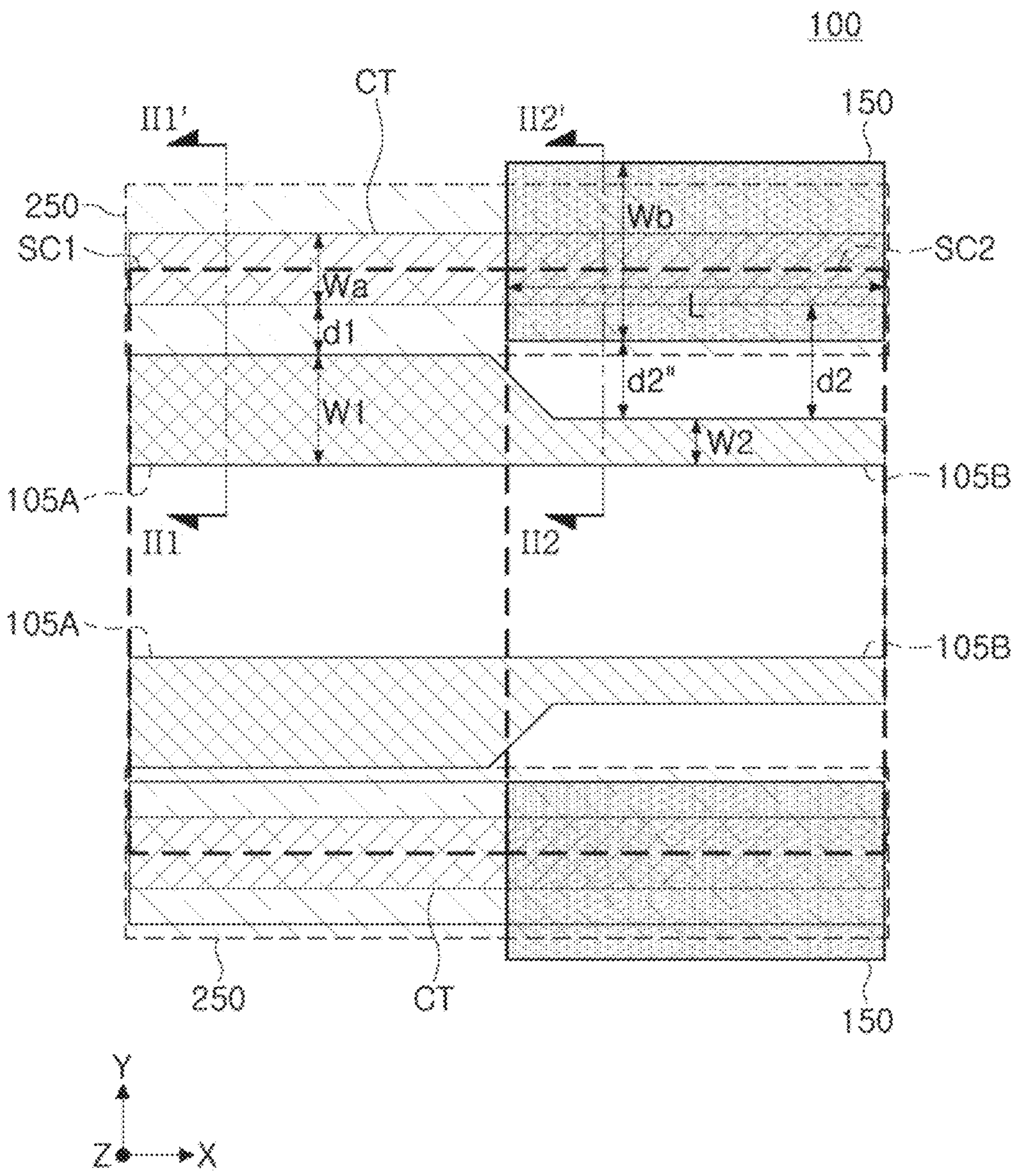
FIGS. 4A and 4B are plan views illustrating an arrangement of fin-type active patterns and a buried conductive structure according to various example embodiments.
Figure 4B:
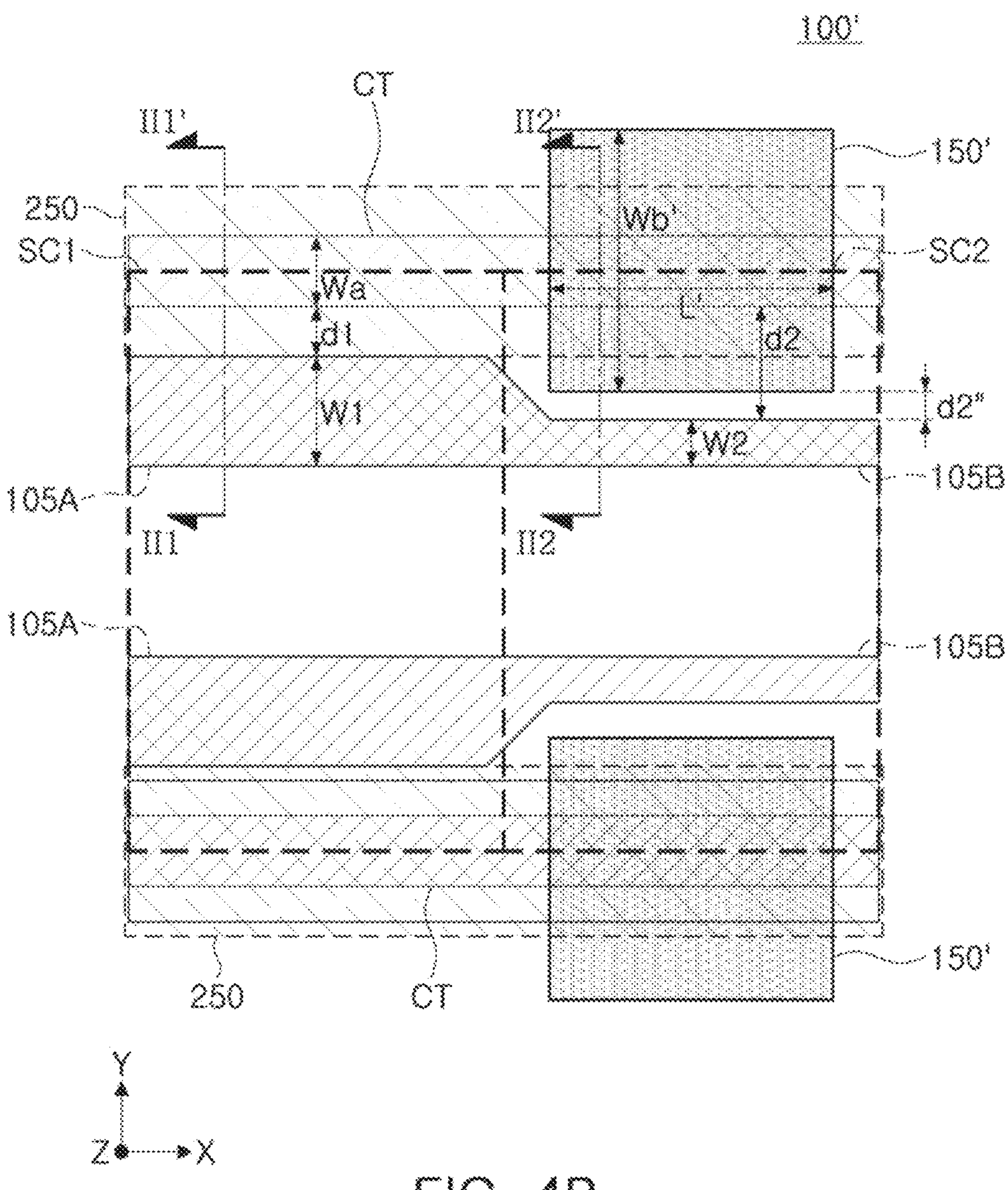

FIGS. 4A and 4B are plan views illustrating an arrangement of fin-type active patterns and a buried conductive structure according to various example embodiments.

Referring to FIG. 4A, an arrangement of the first and second fin-type active patterns 105A and 105B, the buried conductive structure 150, and the conductive through-structure 250 implemented in the cross-sections of FIGS. 1A and 1B are illustrated.

In the present embodiment, as described above, the second width W2 of the second fin-type active pattern 105B is smaller than the first width W1 of the first fin-type active pattern 105A. As shown in FIG. 4A, the first and second fin-type active patterns 105A and 105B may be formed such that side surfaces opposite to the gate isolation structure CT are substantially coplanar with each other.

Specifically, the first fin-type active pattern 105A may have a first side surface facing the gate isolation structure CT and a second side surface opposite to the first side surface, and the second fin-type active pattern 105B may have a side surface substantially coplanar with the first side surface of the first fin-type active pattern 105A.

Due to the arrangement of the first and second fin-type active patterns 105A and 105B, a straight distance d2 between the second fin-type active pattern 105B and the gate isolation structure CT in the second direction (e.g., the Y-direction) may be greater than a straight distance d1 between the first fin-type active pattern 105A and the gate isolation structure CT in the second direction (e.g., the Y-direction). Referring to FIG. 4A, a portion of the gate isolation structure CT adjacent to the first fin-type active pattern 105A is shown, but it should be understood that a portion of the gate isolation structure CT corresponding to the buried conductive structure 150 will be removed in the final semiconductor device 100 and does not exist.

As such, since a space between the second fin-type active pattern 105B and the gate isolation structure CT is larger than a space between the first fin-type active pattern 105A and the gate isolation structure CT, the buried conductive structure 150 may be formed on a portion of the gate isolation structure CT adjacent to the second fin-type active pattern 105B. In addition, the width Wb of the buried conductive structure 150 in the second direction (e.g., the Y-direction) may be greater than the width Wa of the gate isolation structure CT in the second direction (e.g., the Y-direction).

The width Wb of the buried conductive structure 150 employed in the present embodiment in the second direction may satisfy the following Equation (1):

$$Wa < \mathrm{Wb} < (Wa + 2\Delta W) \qquad \text{Equation (1)}$$

where ΔW refers to a difference between the first width W1 and the second width W2.

In addition, as shown in FIG. 4A, a length L of the buried conductive structure 150 in the first direction (e.g., the X-direction) may be extended to a range corresponding to a width of the second cell region SC2 in the first direction (e.g., the X-direction).

As such, in the present embodiment, since the buried conductive structure 150 is formed in a relatively large space of the second cell region SC2, it may have a relatively wide contact area with the conductive through-structure 250. As a result, contact resistance between the buried conductive structure 150 and the conductive through-structure 250 may be reduced.

The formation region of a buried conductive structure 150' may be variously changed under the same conditions.

Referring to FIG. 4B, the semiconductor device 100 according to the present embodiment may include a buried conductive structure 150' extending in the second direction (e.g., the Y-direction) to have a width Wb' greater than that of the previous embodiment. In the present embodiment, a portion of the buried conductive structure 150' may overlap a portion of the first fin-type active pattern 105A in the first direction (e.g., the X-direction). Of course, the buried conductive structure 150' may be spaced apart from the second fin-type active pattern 105B by a predetermined distance (d") to avoid unwanted contact with the second fin-type active pattern 105B and its associated active elements.

Meanwhile, a length L' of the buried conductive structure 150' in the first direction (e.g., the X-direction) may be less than the length L of the previous embodiment. As such, the buried conductive structure 150' may be designed to have an appropriate length within a length range of the second fin-type active pattern 105B in the first direction.

Figure 5A:
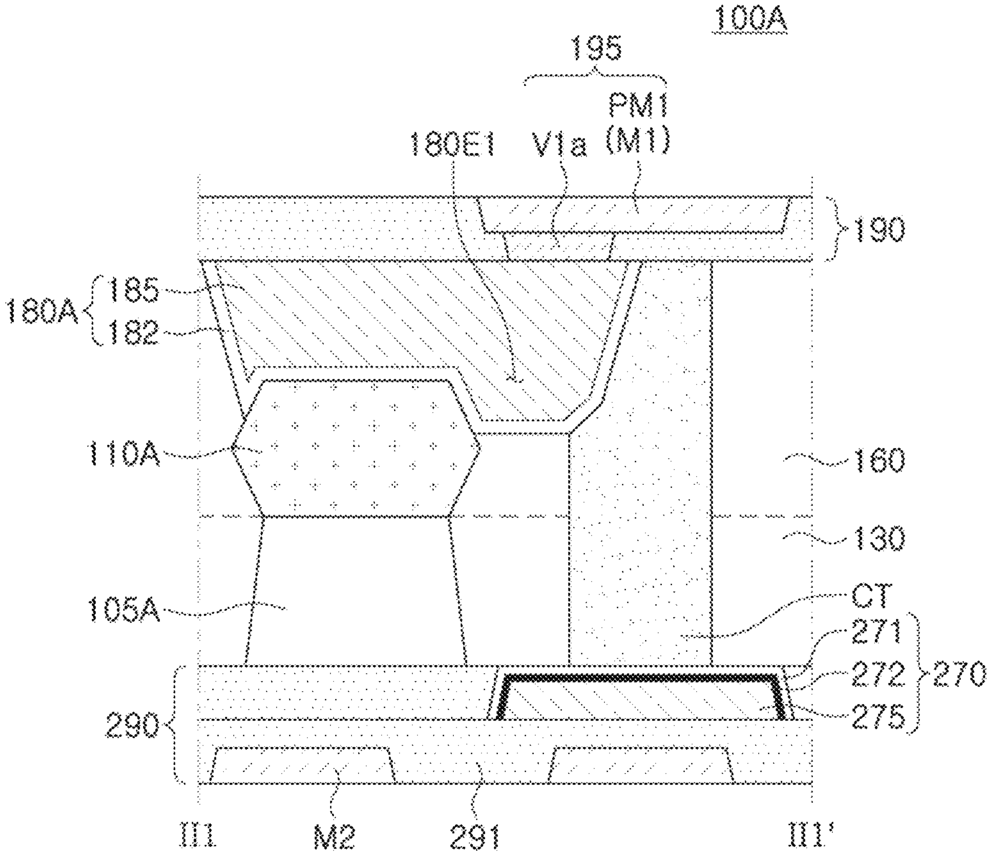
FIGS. 5A and 5B are cross-sectional views of a semiconductor device according to an example embodiment of the present inventive concept.
Figure 5B:
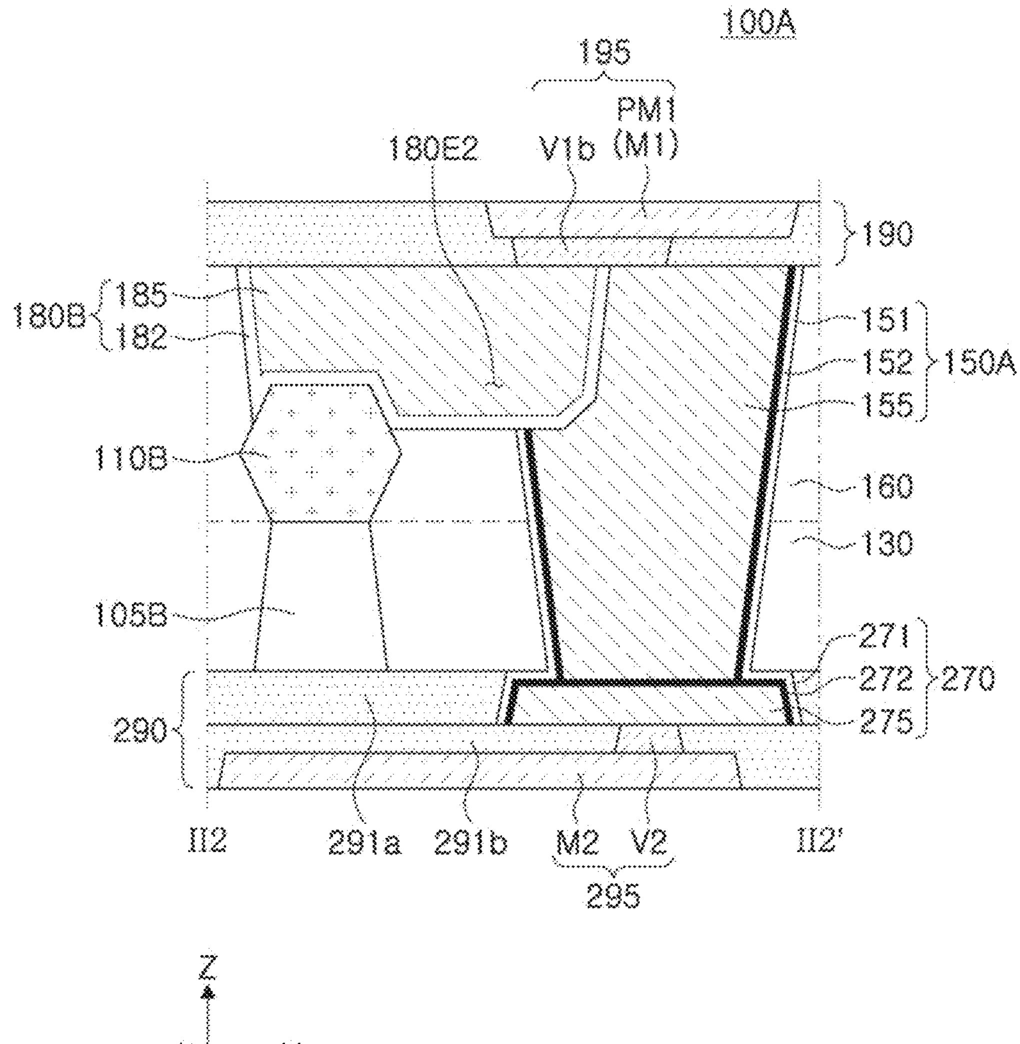

FIGS. 5A and 5B are cross-sectional views of a semiconductor device according to an example embodiment of the present inventive concept.

Referring to FIGS. 5A and 5B, it can be understood that a semiconductor device 100A according to the present embodiment may have similar structures to the semiconductor device 100 illustrated in FIGS. 1 to 4A, except for the facts that portions of the substrate 101 other than the first and second fin-type active patterns 105A and 105B are removed, the second wiring structure 290 is disposed on a lower surface of the device isolation layer 130, and the power delivery line 270 is implemented in the second wiring structure 290 as a power line, instead of the conductive through-structure. In addition, components of the present embodiment may be understood with reference to descriptions of the same or similar components of the semiconductor device 100 illustrated in FIGS. 1 to 4A, unless otherwise stated.

In the semiconductor device 100A according to the present embodiment, a portion of the substrate 101 may be removed through a polishing process. The first and second fin-type active patterns 105A and 105B and the isolation layer 130 may be exposed on a lower surface of the structure obtained after such polishing. The second wiring structure 290 may be formed on the lower surface. The second wiring structure 290 employed in the present embodiment may include a power delivery line 270 connected to the buried conductive structure 150A. The power delivery line 270 may extend in the first direction (e.g., the X-direction) or the second direction (e.g., the Y-direction).

The power delivery line 270 may have a rail structure extending in one direction. For example, the power delivery lines 270 may extend in the first direction (e.g., the X-direction) and be spaced apart from each other in the second direction (e.g., the Y-direction). The power delivery line 270 may include a conductive line 275, a conductive barrier 272 and an insulating liner 271.

Similar to the first wiring structure 190, the second wiring structure 290 may include a plurality of second insulating layers 291 and a second wiring layer 295 disposed on the plurality of second insulating layers 291. Similar to the first wiring layer 195, the second wiring layer 295 may include a metal line M2 and a metal via V2. Here, the metal via V2 may be connected to the power delivery line 270 (see FIG. 5B). In the present embodiment, the second wiring layer 295 of the second wiring structure 290 may be used as a wiring layer for power delivery, and the first wiring layer 195 of the first wiring structure 190 may be used as a wiring layer for signal transmission. Power may be directly delivered from the second wiring structure 290 (in particular, the power delivery line 270) through the buried conductive structure (e.g., buried conductive structure 150A) to the second contact structure 180B in the second cell region SC2, and may be delivered to the first contract structure 190A through the first wiring layer 195 in the first cell region SC1.

According to the present embodiment, since the substrate is removed, a thickness of the final semiconductor device 100A can be reduced, and the conductive through-structure (e.g., conductive through-structure 250 in FIG. 3B) configured to penetrate the substrate can be omitted, thereby simplifying the entire process.

Figure 6A:
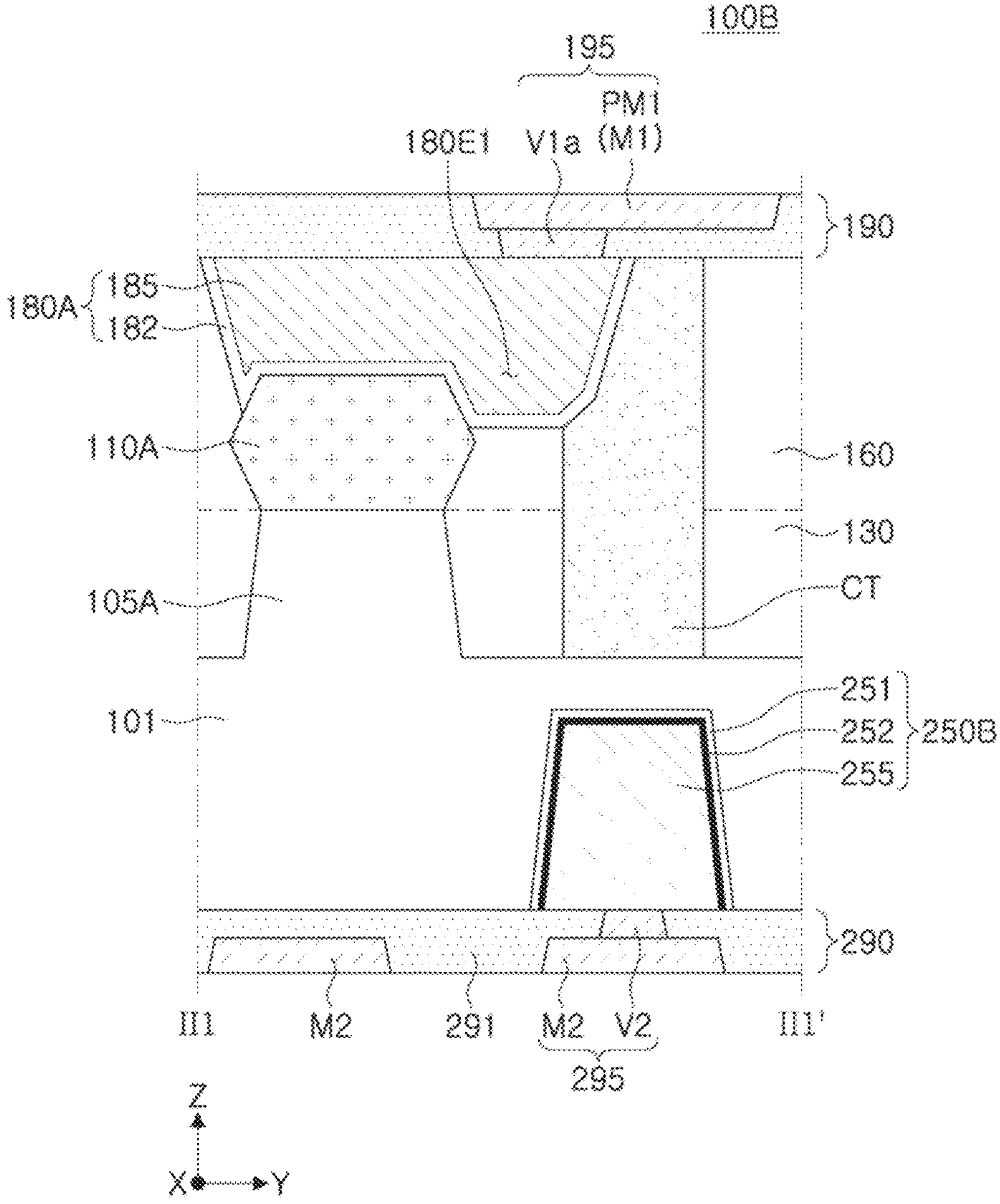
FIGS. 6A and 6B are cross-sectional views of a semiconductor device according to an example embodiment of the present inventive concept.
Figure 6B:
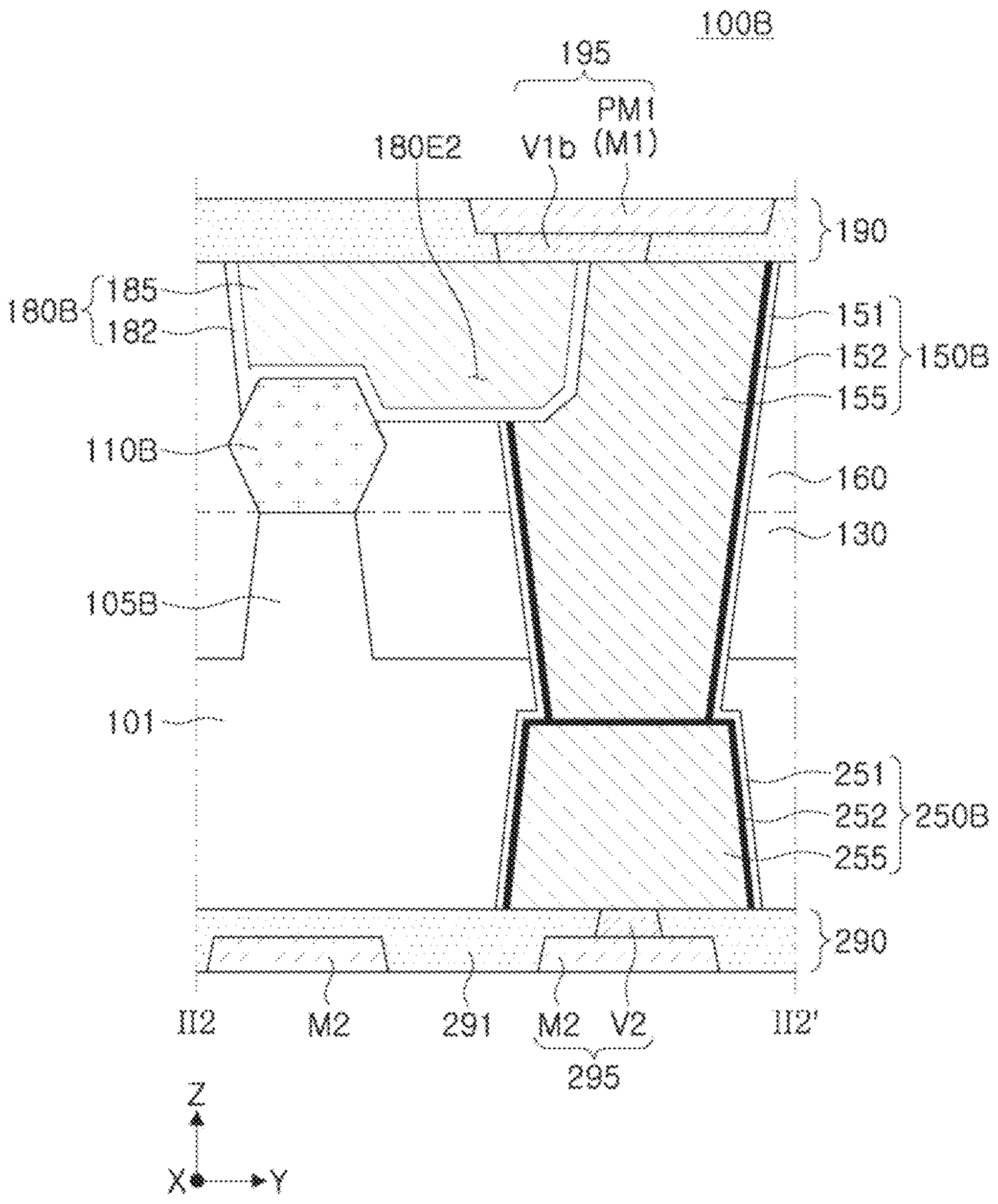

FIGS. 6A and 6B are cross-sectional views of a semiconductor device according to an example embodiment of the present inventive concept.

Referring to FIGS. 6A and 6B, it can be understood that a semiconductor device 100B according to the present embodiment may have similar structures to the semiconductor device 100 illustrated in FIGS. 1 to 4A, except for the fact that contact portions of a buried conductive structure 150B and a conductive through-structure 250B are positioned in the substrate 101. In addition, components of the present embodiment may be understood with reference to descriptions of the same or similar components of the semiconductor device 100 illustrated in FIGS. 1 to 4A, unless otherwise stated.

In the present embodiment, each of the buried conductive structure 150B and the conductive through-structure 250B may be configured such that the contact portions thereof are positioned within the substrate 101. The buried conductive structure 150B may be formed to penetrate the interlayer insulating portion (e.g., the interlayer insulating layer 160 and the device isolation layer 130) and extend into the substrate 101, and the conductive through-structure 250B may extend from the second surface of the substrate 101 and contact a bottom surface of the buried conductive structure 150B.

The buried conductive structure 150B employed in the present embodiment may include a first contact plug 155, a first conductive barrier 152 disposed on a side surface and a bottom surface of the first contact plug 155, and a first insulating liner 151 positioned on a portion of the first conductive barrier 152 surrounding the side surface of the contact plug 155. In addition, the conductive through-structure 250 may has a trench structure penetrating the substrate 101 and extending in the first direction (e.g., the X-direction), and include a second contact plug 255, a second conductive barrier 252 disposed on a side surface and an upper surface of the second contact plug 255, and a second insulating liner 251 disposed between the second conductive barrier 252 and the substrate 101.

As such, the structure of the conductive through-structure 250B may be variously changed along with the contact portions of the buried conductive structure 150B and the conductive through-structure 250B. In the previous embodiment, it was described that the conductive through-structure 250 also has a trench structure (or rail structure) extending along the first direction, but may be formed to have a through-hole structure (see FIG. 7).

Figure 7:
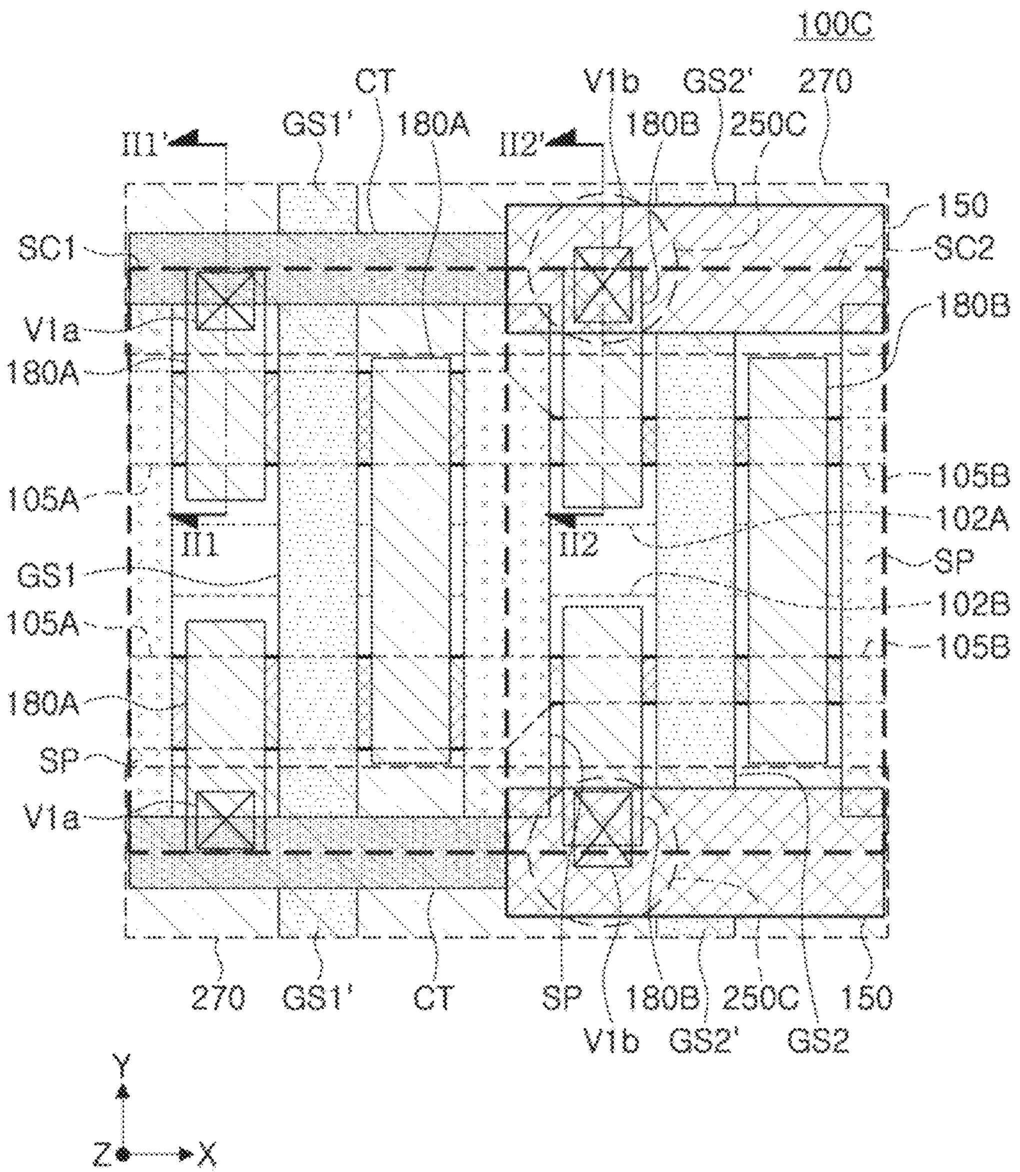
FIG. 7 is a plan view illustrating a semiconductor device according to an example embodiment of the present inventive concept.
Figure 8A:
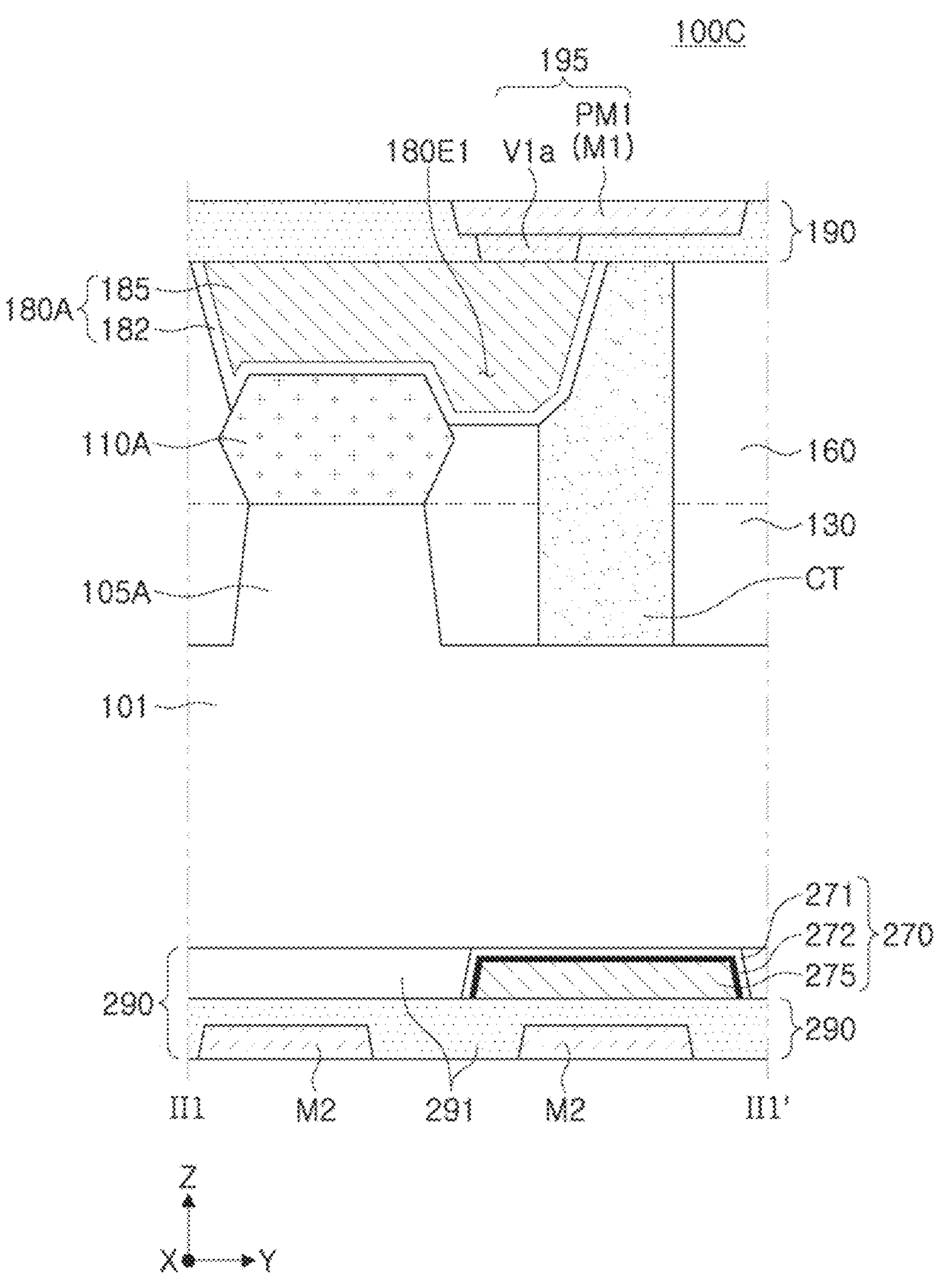
FIGS. 8A and 8B are cross-sectional views of the semiconductor device of FIG. 7 taken along lines II1-II1' and II2-II2'.
Figure 8B:
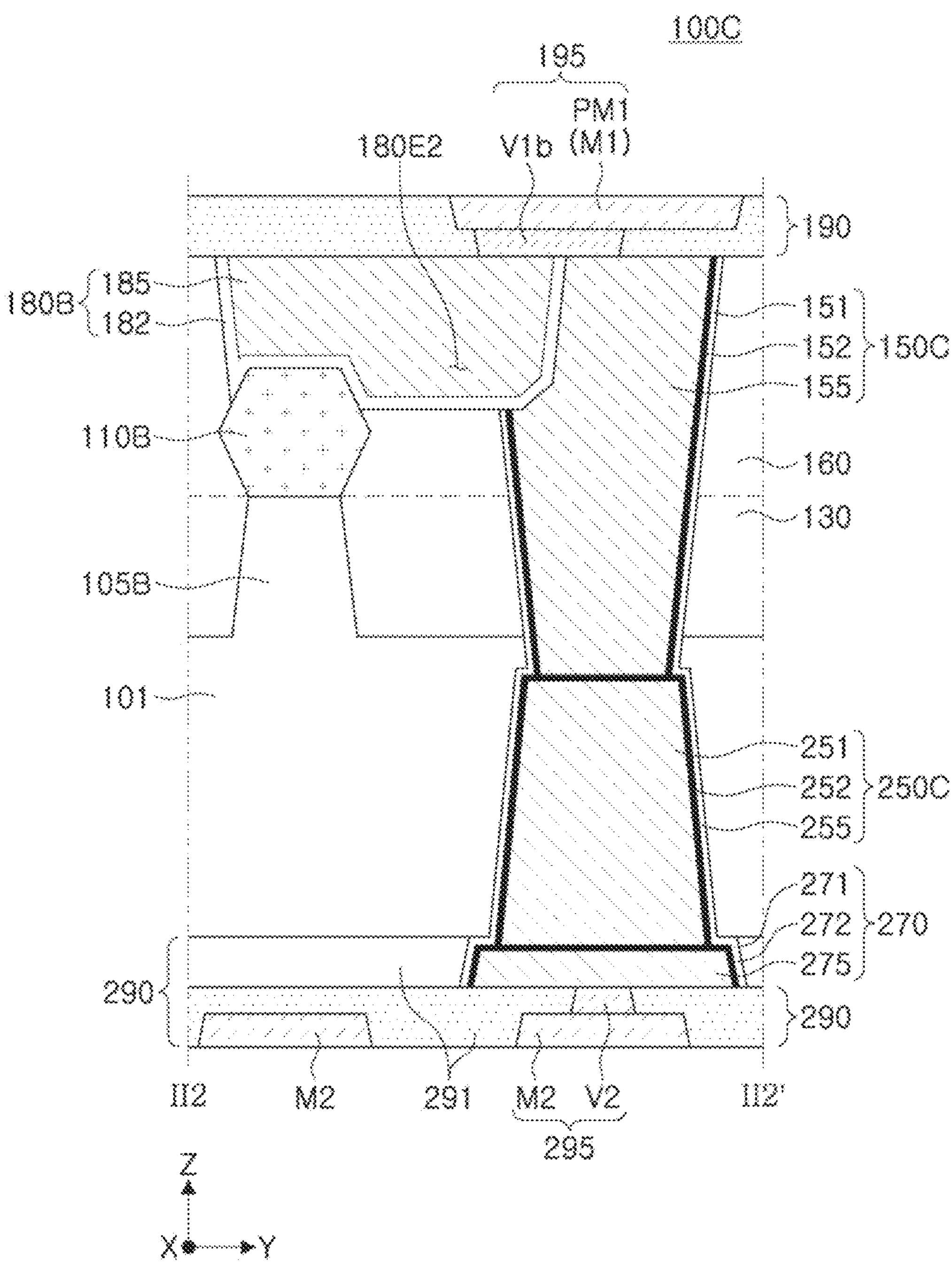

FIG. 7 is a plan view illustrating a semiconductor device according to an example embodiment of the present inventive concept, and FIGS. 8A and 8B are cross-sectional views of the semiconductor device of FIG. 7 taken along lines II1-II1' and II2-II2'.

Referring to FIGS. 7, 8A, and 8B, it can be understood that a semiconductor device 100C according to the present embodiment may have similar structures to the semiconductor device 100 illustrated in FIGS. 1 to 4A, except for the facts that contact portions of a buried conductive structure 150C and a conductive through-structure 250C are positioned in the substrate 101, and the conductive through-structure 250C has a hole structure unlike the previous embodiment. In addition, components of the present embodiment may be understood with reference to descriptions of the same or similar components of the semiconductor device 100 illustrated in FIGS. 1 to 4A, unless otherwise stated.

In the present embodiment, similar to the previous embodiment (see FIG. 6B), the buried conductive structure 150C and the conductive through-structure 250C may be configured such that the contact portions thereof are positioned within the substrate 101. In addition, the conductive through-structure 250C employed in the present embodiment may have a through hole structure as shown in FIG. 7.

A second wiring structure 290 may be formed on the second surface of the substrate 101. The second wiring structure 290 employed in the present embodiment may include a power delivery line 270 connected to the conductive through-structure 250C of a hole-structure. A plurality of the power delivery line 270 may extend in the first direction (e.g., the X-direction) or the second direction (e.g., the Y-direction), and be connected to a plurality of the conductive through-structures 250C, respectively.

The power delivery lines 270 may have a rail structure extending lengthwise in one direction. For example, as shown in FIG. 7, the power delivery lines 270 may extend lengthwise in the first direction (e.g., the X-direction), and be spaced apart from each other in the second direction (e.g., the Y-direction).

Similar to the first wiring structure 190, the second wiring structure 290 may include a plurality of second insulating layers 291 and a second wiring layer 295 disposed on the plurality of second insulating layers 291. Similar to the first wiring layer 195, the second wiring layer 295 may include a metal line M2 and a metal via V2. Here, the metal via V2 may be connected to the power delivery line 270 (see FIG. 8B). Power may be directly delivered from the second wiring structure 290 (in particular, the power delivery line 270) through the buried conductive structure (e.g., buried conductive structure 150A) to the second contact structure 180B in the second cell region SC2, and may be delivered to the first contract structure 190A through the first wiring layer 195 in the first cell region SC1.

Figure 9:
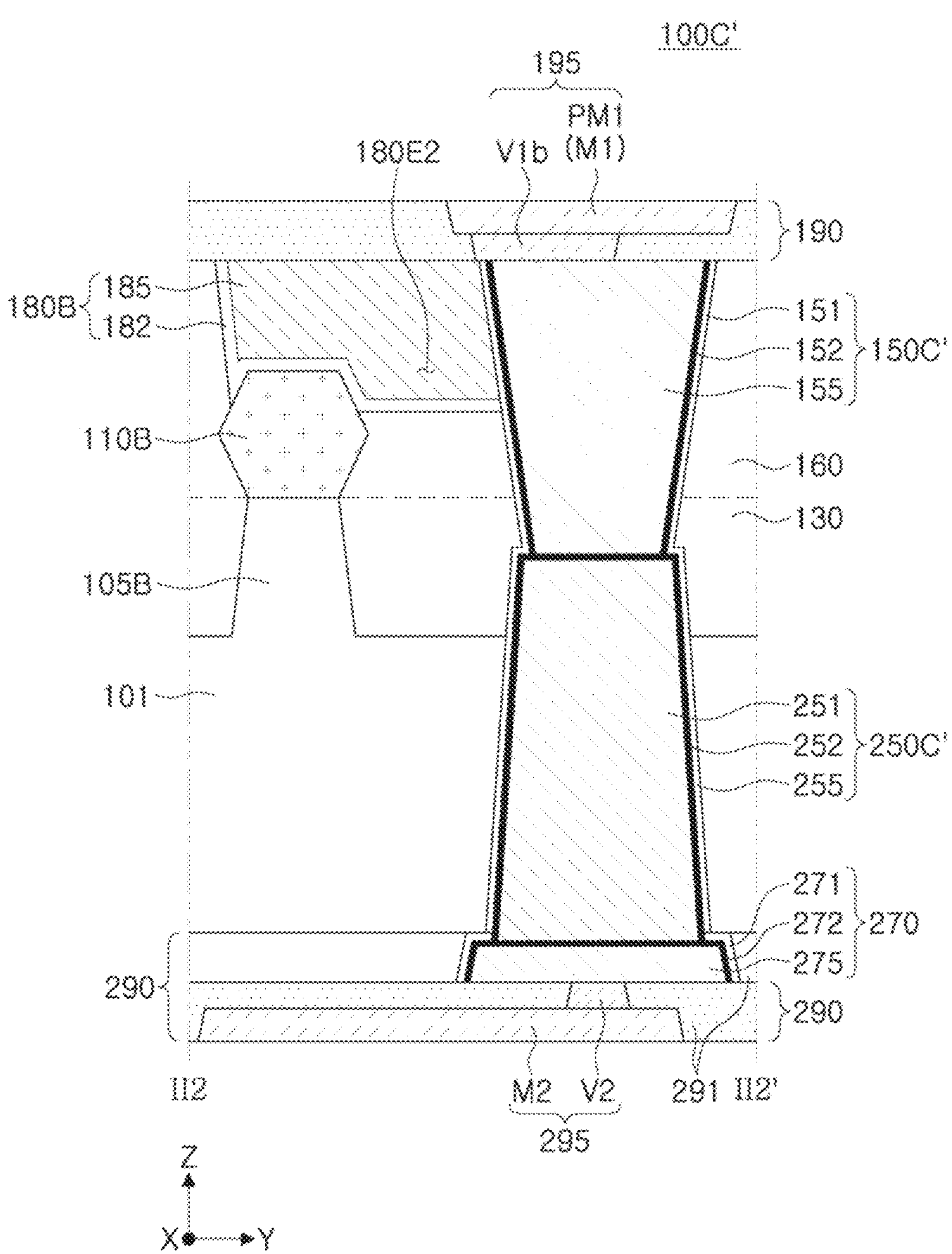
FIG. 9 is a cross-sectional view of a semiconductor device according to an example embodiment of the present inventive concept.

FIG. 9 is a cross-sectional view of a semiconductor device according to an example embodiment of the present inventive concept.

Referring to FIG. 9, it can be understood that a semiconductor device 100C' according to the present embodiment may have similar structures to the semiconductor device 100C illustrated in FIGS. 7, 8A, and 8B, except for the fact that contact portions of a buried conductive structure 150C' and a conductive through-structure 250C' are positioned in the interlayer insulating portion (e.g., the device isolation layer 130). In addition, components of the present embodiment may be understood with reference to descriptions of the same or similar components of the semiconductor device 100C illustrated in FIGS. 7, 8A, and 8B, unless otherwise stated.

Similar to the embodiment shown in FIGS. 8A and 8B, the conductive through-structure 250C' employed in the present embodiment may have a hole structure, and the power delivery line 270 may be connected to the conductive through-structure 250C' of a hole structure. A second wiring structure 290 employed in the present embodiment may be disposed on the second surface of the substrate 101, and include the power delivery line 270 and a second wiring layer 295 connected to the power delivery line 270.

In the present embodiment, each of the buried conductive structure 150C' and the conductive through-structure 250C' may be configured such that the contact portions thereof are positioned within an interlayer insulating portion (in particular, the device isolation layer 130). The buried conductive structure 150C' may be formed to penetrate the interlayer insulating layer 160 and extend to a partial region of the isolation layer 130, and the conductive through-structure 250C' may extend from the second surface of the substrate 101 and contact a bottom surface of the buried conductive structure 150C'. Since the conductive through-structure 250C employed in the present embodiment has a hole structure, it may be formed to extend to a partial area of the isolation layer 130.

Figure 10:
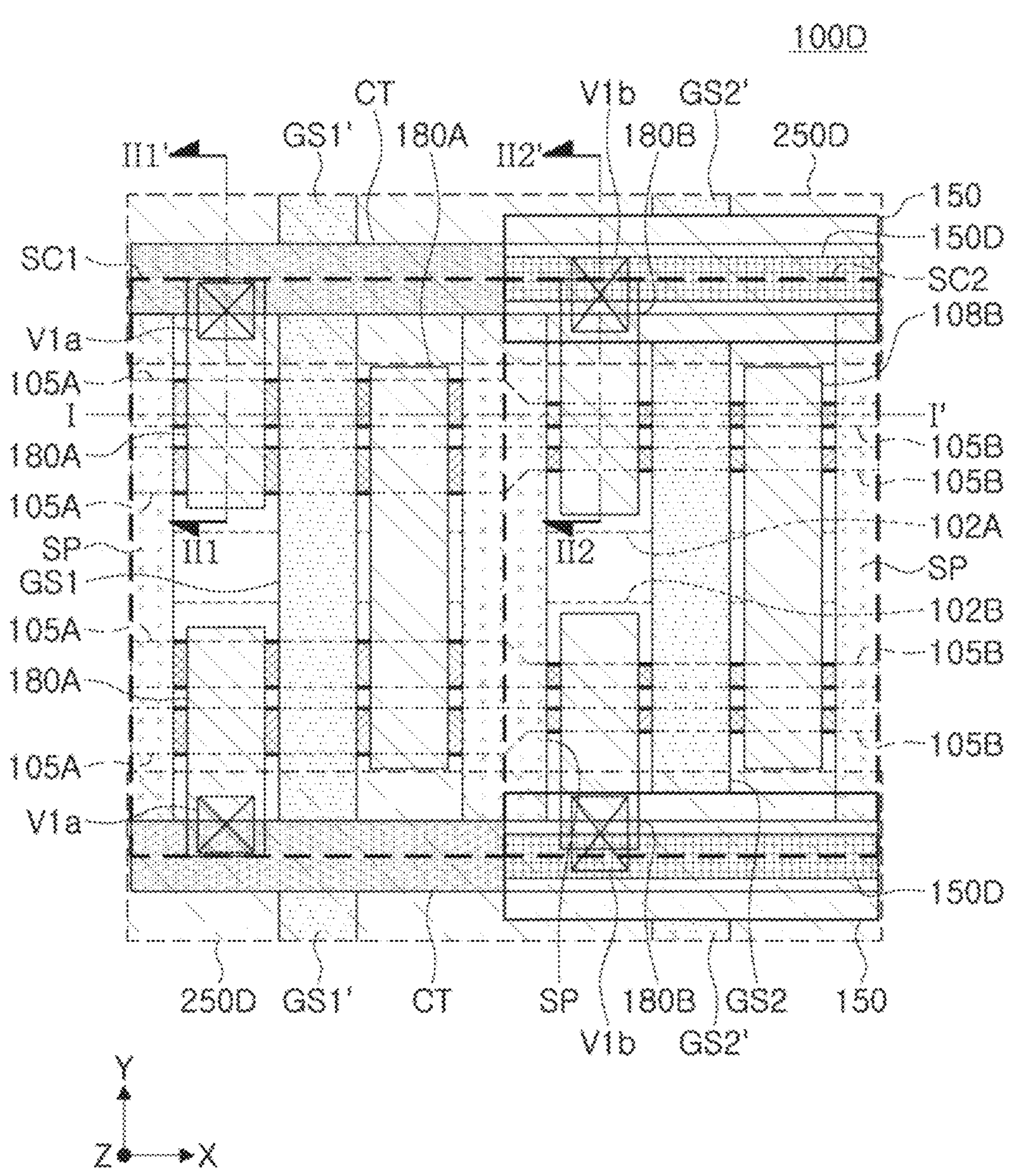
FIG. 10 is a plan view illustrating a semiconductor device according to an example embodiment of the present inventive concept.
Figure 11:
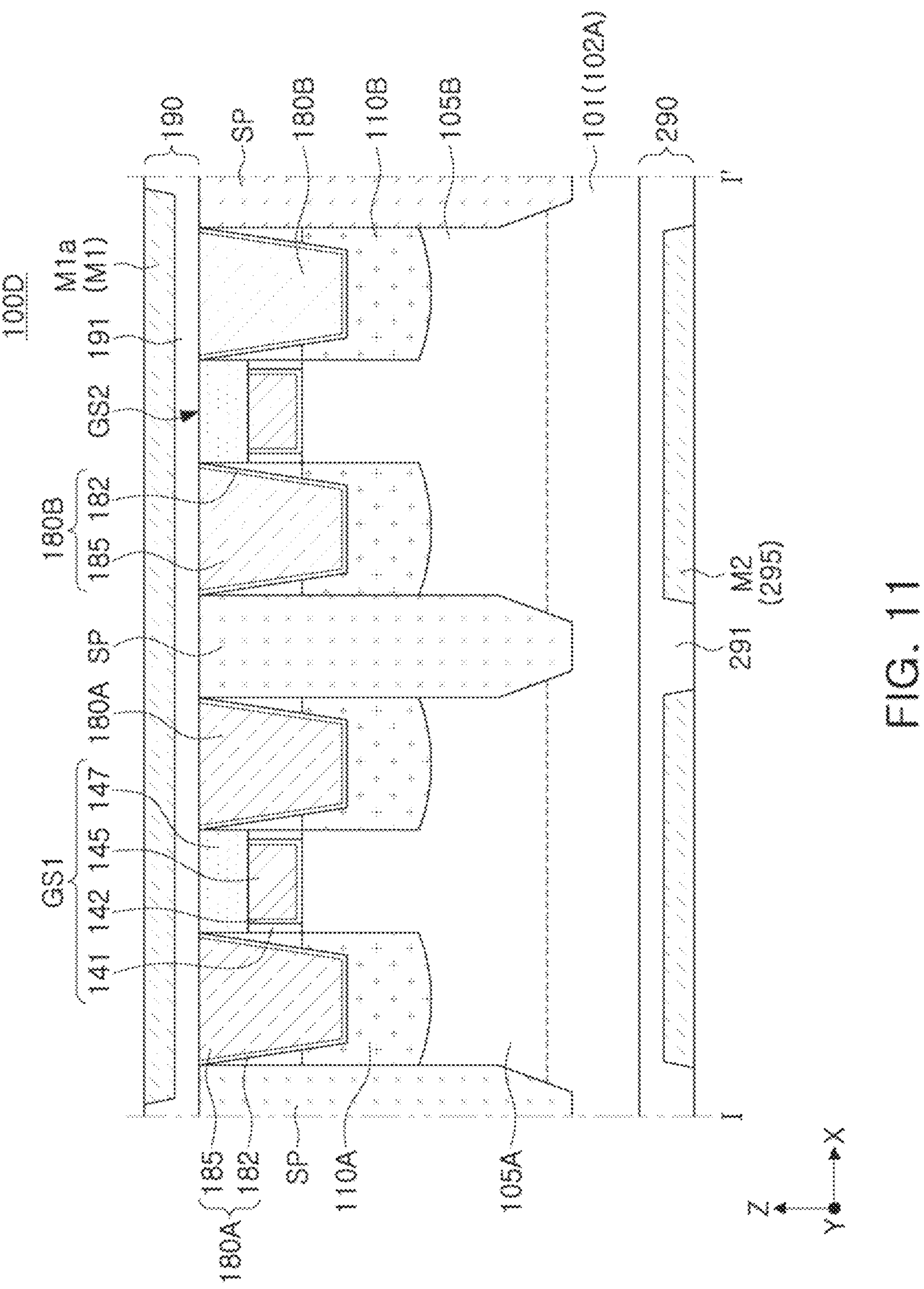
FIG. 11 is a cross-sectional view of the semiconductor device of FIG. 10 taken along line II'.
Figure 12A:
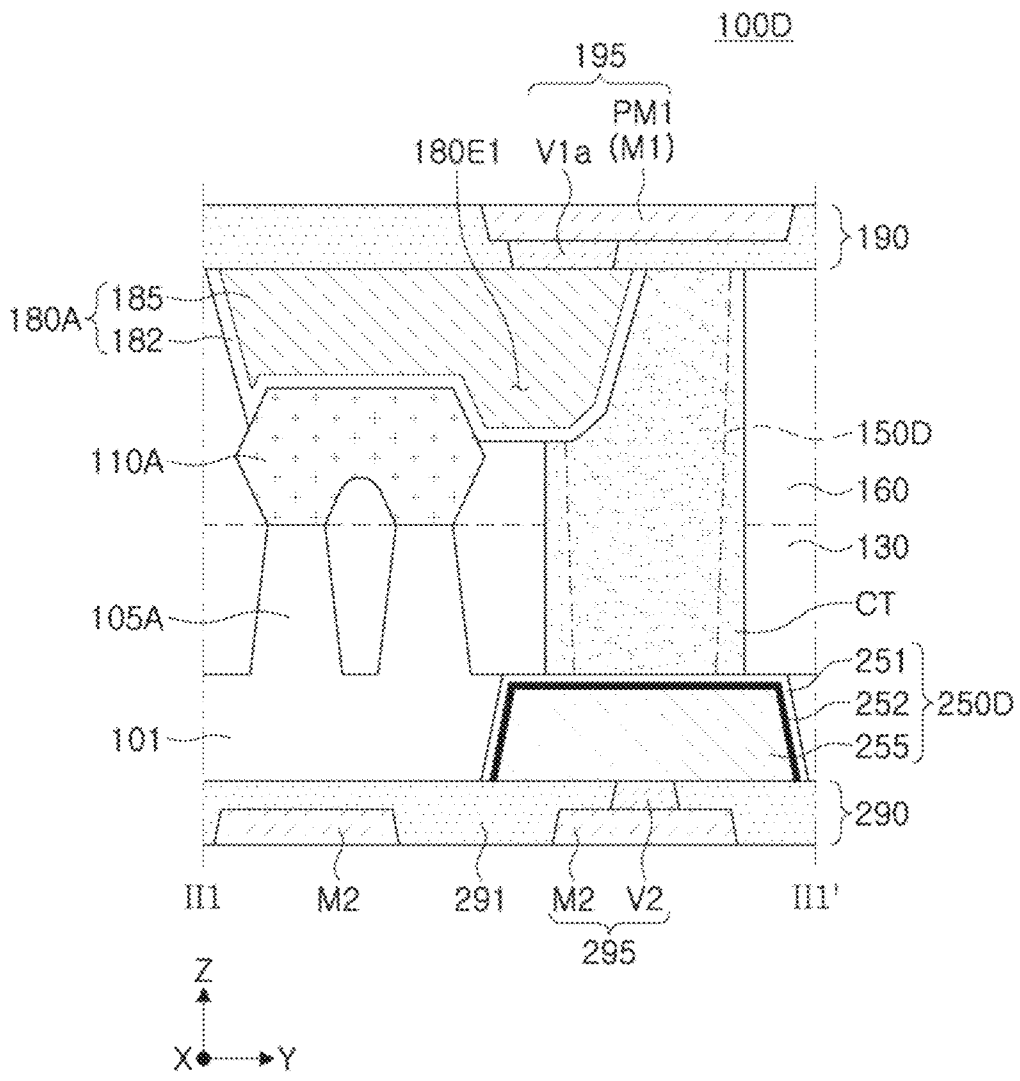
FIGS. 12A and 12B are cross-sectional views of the semiconductor device of FIG. 10 taken along lines II1-II1 ' and II2-II2'.
Figure 12B:
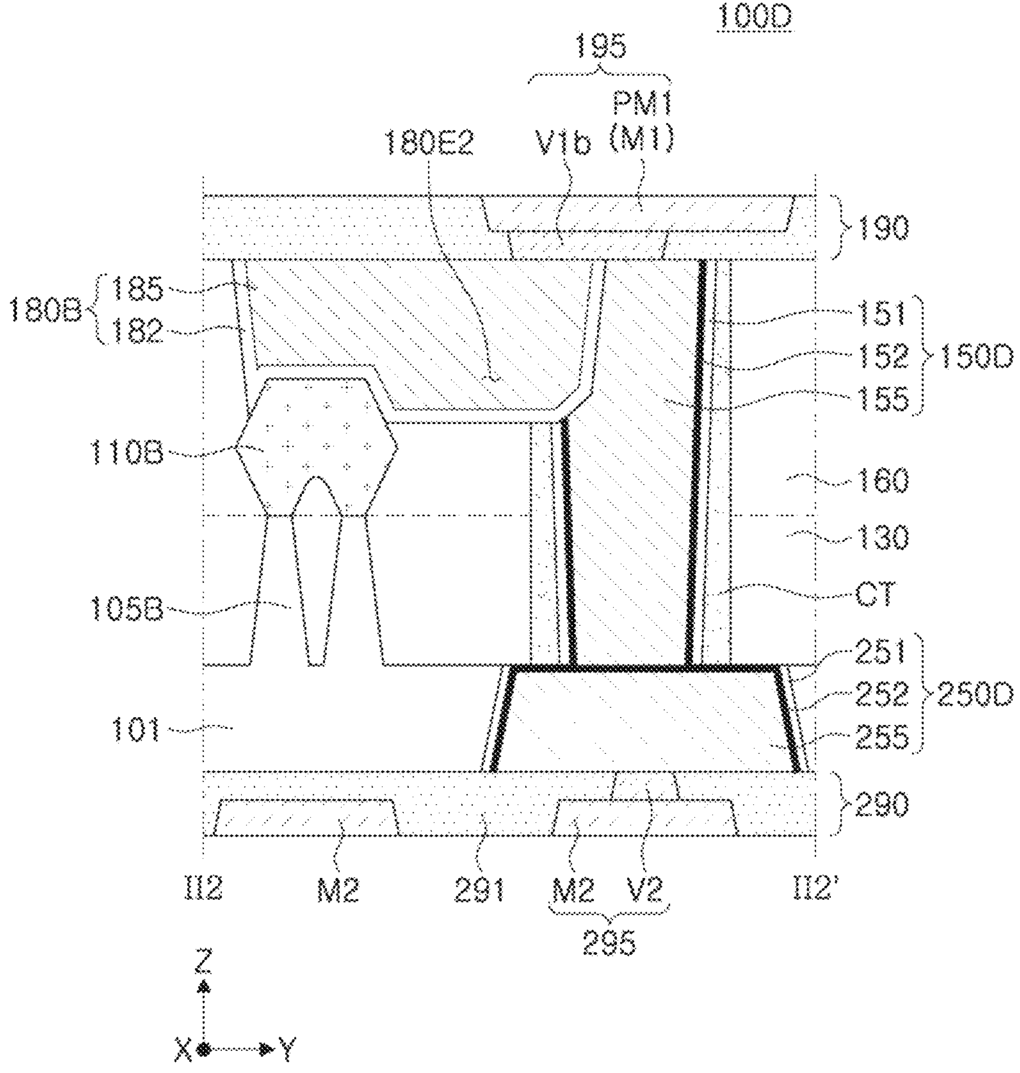

FIG. 10 is a plan view illustrating a semiconductor device according to an example embodiment of the present inventive concept, FIG. 11 is a cross-sectional view of the semiconductor device of FIG. 10 taken along line IT, and FIGS. 12A and 12B are cross-sectional views of the semiconductor device of FIG. 10 taken along lines II1-II1 and II2-II2'.

Referring to FIGS. 11, 12A, and 12B together with FIG. 10, it can be understood that a semiconductor device 100D according to the present embodiment may have similar structures to the semiconductor device 100 illustrated in FIGS. 1 to 3, except for the facts that a channel region is provided with two active fins 105A or 105B in each cell region, and a buried conductive structure 150D extends lengthwise in the first direction (e.g., the X-direction) in the gate isolation structure CT positioned in the second cell region SC2. In addition, components of the present embodiment may be understood with reference to descriptions of the same or similar components of the semiconductor device 100 illustrated in FIGS. 1 to 3, unless otherwise stated.

Unlike the multi-channel layers stacked in the vertical direction of the previous embodiment, the channel region employed in the present embodiment may include first and second active fins 105A and 105B. Each of the first active fins 105A may have a structure extending lengthwise in a first direction (e.g., an X-direction) in the first cell region SC1 of the substrate 101, and protruding upwardly (e.g., in the Z-direction) from the active region 102.

Similarly, each of the second active fins 105B may have a structure extending lengthwise in the first direction (e.g., the X-direction) in the second cell region SC2 of the substrate 101, and protruding upwardly (e.g., in the Z-direction) from the active region 102.

In the present embodiment, it can be understood that the second active fins 105B are structures in which the second active fins 105B have widths smaller than a width of each of the first active fins 105A, the second active fins 105B is arranged to overlap the respective first active fins 105A in the first direction (e.g., the X-direction), and each one fin structure is isolated by the device isolation pattern SP.

A plurality of active fins 105A and 105B may be arranged side by side in the second direction (e.g., the Y-direction) in the active region 102. With reference to FIGS. 10, 11A, and 11B, the adjacently arranged two active fins 105A and 105B may provide a channel region for one transistor. In the present embodiment, the active fins 105A as well as the active fins 105B are exemplified as being provided by two, but are not limited thereto, and may be provided singly or in a plurality (e.g., three or more) thereof.

As shown in FIG. 10, the first and second active fins 105A and 105B adjacent to the gate isolation structure CT may be arranged to have different distances from the gate isolation structure CT in the second direction (e.g., the Y-direction). The adjacent first and second active fins 105A and 105B may be arranged such that side surfaces opposite to the gate isolation structure CT are substantially coplanar with each other. In the present embodiment, a difference in a distance between the first active fin 105A and the gate isolation structure CT in the second direction (e.g., the Y-direction) and a distance between the second active fin 105B and the gate isolation structure CT in the second direction (e.g., the Y-direction) may be defined as a difference in width between the first and second active fins 105A and 105B.

A semiconductor device 100D according to the present embodiment may include first and second source/drain regions 110A and 110B formed across two first and second active fins 105A and 105B, and first and second contact structures 180A and 180B connected to the first and second source/drain regions 110A and 110B, respectively.

The first and second gate structures GS1 and GS2 employed in the present embodiment may extend to intersect the active fins 105. The first and second gate structures GS1 and GS2 may include gate spacers 141, a gate insulating layer 142 and a gate electrode 145 sequentially disposed between the gate spacers 141, and a gate capping layer 147 disposed on the gate electrode 145.

In the first and second cell regions SC1 and SC2, the gate isolation structure CT may extend in the first direction in order to isolate the first gate structures GS1 and GS1' and the second gate structures GS2 and GS2', respectively. Each of end surfaces of the isolated first and second gate structures GS1, GS1', GS2 and GS2' may contact both side surfaces of the gate isolation structure CT, respectively. The gate isolation structure CT may extend in the first direction (e.g., the X-direction) along a boundary (i.e., an upper boundary) of the first and second cell regions SC1 adjacent to the first and second active fins 105A and 105B. In the present embodiment, the gate isolation structure CT may be disposed at upper and lower boundaries defining heights of the first and second cell regions SC1 and SC2, respectively.

In the present embodiment, after removing at least a portion of the gate isolation structure CT positioned in the first cell region SC1, the buried conductive structure 150D may be formed in the removed region. As shown in FIGS. 10 and 12B, in the second cell region SC2, the buried conductive structure 150D may extend lengthwise in the first direction (e.g., the X-direction) within the gate isolation structure CT.

As illustrated in FIG. 12A, the buried conductive structure 150D employed in the present embodiment may have a width in the second direction (e.g., the Y-direction) smaller than a width of the gate isolation structure CT in the second direction (e.g., the Y-direction).

As shown in FIG. 12B, the conductive through-structure 250D may extend from the second surface of the substrate 101 toward the first surface, and be connected to the buried conductive structure 150D. As shown in FIG. 10, the conductive through-structure 250D may extend along the first direction (e.g., the X-direction).

In the present embodiment, the conductive through-structure 250D may be connected to a lower surface of the gate isolation structure CT in the first cell area SC1 (see FIG. 12A), and may contact the buried conductive structure 150D in the second cell area SC2 (see FIG. 12B).

Referring to FIGS. 10, 12A, and 12B, the semiconductor device 100D according to the present embodiment may supply power to the first cell region SC1 as well as the second cell region SC2 through the buried conductive structure 150D adjacent to the second active fin 105B in the second cell region SC2.

First, referring to FIG. 12B, the buried conductive structure 150D may be directly connected to the second contact structure 180B disposed in the second source/drain region 110B. For example, the buried conductive structure 150D may contact the second contact structure 180B disposed in the second source/drain region 110B. The second contact structure 180B may have an extension portion 180E2 extending in the second direction (e.g., the Y-direction). The extension portion 180E2 of the second contact structure 180B may be connected to the buried conductive structure 150D positioned in the gate isolation structure CT. Desired power (e.g., drain voltage VDD or source voltage VSS) may be supplied to the second cell region SC2 through this connection.

Meanwhile, the first interconnection structure 190 disposed on the interlayer insulating layer 160 may connect the buried conductive structure 150D to the first source/drain region 110A related to the first active fin 105A and also supply desired power (e.g., drain voltage VDD or source voltage VSS) to the first cell region SC1.

Specifically, referring to FIGS. 12A and 12B, the first wiring layer 195 may include a first metal line M1 extending in the first direction (e.g., the X-direction), and a second metal via V1*b* electrically connecting the first metal line M1 and the buried conductive structure 150. The second metal via V1*b* may be connected to at least one of the buried conductive structure 150 and the extension portion 180E2 of the second contact structure 180B. The first metal line M1 may extend in the first direction (e.g., the X-direction), and be formed across the first and second cell areas SC1 and SC2.

Referring to FIG. 12A, similar to the second contact structure 180B, the first contact structure 180A may have an extension portion 180E1 extending in the second direction (e.g., the Y-direction). The extension portion 180E1 of the first contact structure 180A may overlap the first metal line M1 in the vertical direction (e.g., the Z-direction). In the present embodiment, the extension portion 180E1 of the first contact structure 180A may have a portion overlapping a portion of the gate isolation structure CT. In the first cell region SC1, the first metal line M1 may be connected to the extension portion 180E1 of the first contact structure 180A through a first metal via V1*a*. Through the connection structure of the first wiring layer 195, the buried conductive structure 150D may supply power (e.g., source voltage VSS or drain voltage VDD) to the first source/drain region 110A positioned' in the first cell region SC1.

In the present embodiment, the power delivery structure (the buried conductive structure 150D and the conductive through-structure 250D) may be configured to be formed on the upper and lower boundaries of the first and second cell regions SC1 and SC2, respectively, and supply power (e.g., drain voltage VDD and source voltage VSS) to the active regions of the first and second cell regions SC1 and SC2.

In a semiconductor device having a first fin-type active pattern having a first width and a second fin-type active pattern having a second width, smaller than the first width, it is possible to realize a power delivery system capable of effectively utilizing a limited space by disposing a buried conductive structure in a portion of a gate isolation structure adjacent to the second fin-type active region. In some embodiments, the buried conductive structure may supply power to the second fin-type active pattern through a direct connection with the second contact structure, and may supply power to the first fin-type active pattern through a wiring layer.

While example embodiments have been shown and described above, it will be apparent to those skilled in the art that modifications and variations could be made without departing from the scope of the present inventive concept as defined by the appended claims.

What is claimed is:

1. A semiconductor device, comprising:

a substrate having first and second surfaces opposite to each other;

a first fin-type active pattern extending lengthwise in a first direction on the first surface of the substrate and having a first width in a second direction intersecting the first direction;

a second fin-type active pattern spaced apart from the first fin-type active pattern in the first direction, and extending lengthwise in the first direction on the first surface of the substrate, the second fin-type active pattern having a second width in the second direction, the second width being smaller than the first width;

a device isolation pattern disposed between the first and second fin-type active patterns;

first and second gate structures extending lengthwise in the second direction, and crossing the first and second fin-type active patterns, respectively;

a first source/drain region disposed on the first fin-type active pattern on at least one side of the first gate structure;

a second source/drain region disposed on the second fin-type active pattern on at least one side of the second gate structure;

an interlayer insulating portion disposed on the first surface of the substrate, and covering the first and second source/drain regions;

first and second contact structures disposed in the interlayer insulating portion and connected to the first and second source/drain regions, respectively;

a gate isolation structure positioned adjacent to the first fin-type active pattern in the second direction in the interlayer insulating portion, and extending lengthwise in the first direction while contacting one end surface of the first gate structure;

a buried conductive structure extending in the first direction while contacting one end surface of the gate isolation structure in the interlayer insulating portion, and connected to the second contact structure;

a conductive through-structure extending from the second surface of the substrate toward the first surface of the substrate, and connected to the buried conductive structure; and a first wiring structure disposed on the interlayer insulating portion, and having a first wiring layer electrically connected to the first contact structure and the buried conductive structure.

2. The semiconductor device of claim 1, wherein the buried conductive structure has a width in the second direction greater than a width of the gate isolation structure in the second direction.

3. The semiconductor device of claim 1, wherein the first fin-type active pattern has a first side surface facing the gate isolation structure and a second side surface opposite to the first side surface, and wherein the second fin-type active pattern has a side surface that is substantially coplanar with the first side surface of the first fin-type active pattern.

4. The semiconductor device of claim 3, wherein a width Wb of the buried conductive structure in the second direction satisfies Equation (1) below:

$$Wa < \mathrm{Wb} < (Wa + 2\Delta W) \quad \text{Equation (1)}$$

where Wa denotes a width of the gate isolation structure, and ΔW denotes a difference between the first width and the second width.

5. The semiconductor device of claim 1, wherein the first contact structure has a first extension portion extending in the second direction, and wherein the first wiring layer comprises a metal line extending in the first direction and a first metal via electrically connecting the metal line and the first extension portion.

6. The semiconductor device of claim 5, wherein the first extension portion of the first contact structure overlaps a portion of the gate isolation structure.

7. The semiconductor device of claim 5, wherein the second contact structure has a second extension portion extending in the second direction and connected to the buried conductive structure, and wherein the first wiring layer further comprises a second metal via electrically connecting the metal line and the buried conductive structure.

8. The semiconductor device of claim 7, wherein the second metal via is connected to both the buried conductive structure and the second extension portion.

9. The semiconductor device of claim 1, wherein the conductive through-structure penetrates the substrate and extends into the interlayer insulating portion, and is connected to the buried conductive structure in the interlayer insulating portion.

10. The semiconductor device of claim 9, wherein the buried conductive structure comprises a first conductive material and a first conductive barrier surrounding a side surface and a lower surface of the first conductive material, and wherein the conductive through-structure comprises a second conductive material, a second insulating liner surrounding a side surface of the second conductive material, and a second conductive barrier disposed between the second conductive material and the second insulating liner and extending to an upper surface of the second conductive material.

11. The semiconductor device of claim 1, wherein the buried conductive structure is connected to the conductive through-structure in the substrate.

12. The semiconductor device of claim 11, wherein the buried conductive structure comprises a first conductive material, a first insulating liner surrounding a side surface of the first conductive material, and a first conductive barrier disposed between the first conductive material and the first insulating liner and extending to a bottom surface of the first conductive material, and wherein the conductive through-structure comprises a second conductive material, a second insulating liner surrounding a side surface of the second conductive material, and a second conductive barrier disposed between the second conductive material and the second insulating liner and extending to an upper surface of the second conductive material.

13. The semiconductor device of claim 1, wherein the conductive through-structure has a trench structure extending in the first direction.

14. The semiconductor device of claim 1, further comprising:

a power delivery line disposed on the second surface of the substrate, and connected to the conductive through-structure, wherein the conductive through-structure has at least one hole structure connecting the power delivery line and the buried conductive structure.

15. The semiconductor device of claim 1, further comprising:

a second wiring structure disposed on the second surface of the substrate, and having a second wiring layer electrically connected to the conductive through-structure.

16. The semiconductor device of claim 1, further comprising:

a plurality of semiconductor patterns disposed on each of the first and second fin-type active patterns, and spaced apart from each other in a direction perpendicular to the first surface of the substrate, wherein the first and second gate structures each comprise a gate electrode surrounding the plurality of semiconductor patterns on the first and second fin-type active patterns, respectively, and extending in the second direction, and a gate insulating layer disposed between the plurality of semiconductor patterns and the gate electrode.

17. A semiconductor device, comprising:

a substrate having a first surface having a first cell region and a second cell region arranged in a first direction, and a second surface opposite to the first surface;

a first fin-type active pattern extending lengthwise in the first direction in the first cell region of the substrate and having a first width in a second direction intersecting the first direction;

a second fin-type active pattern overlapping the first fin-type active pattern in the first direction in the second cell region of the substrate, extending lengthwise in the first direction, and having a second width in the second direction, the second width being smaller than the first width;

a device isolation pattern disposed between the first and second fin-type active patterns along a boundary between the first and second cell regions;

first and second gate structures disposed in the first and second cell regions, respectively, and extending lengthwise in the second direction to cross the first and second fin-type active patterns, respectively;

a first source/drain region disposed on the first fin-type active pattern on at least one side of the first gate structure;

a second source/drain region disposed on the second fin-type active pattern on at least one side of the second gate structure;

first and second contact structures connected to the first and second source/drain regions, respectively, and extending in a direction perpendicular to the first surface of the substrate;

a gate isolation structure positioned at a boundary of the first cell region adjacent to the first fin-type active pattern in the second direction, and extending in the first direction while contacting one end surface of the first gate structure;

a buried conductive structure positioned at a boundary of the second cell region adjacent to the second fin-type active pattern in the second direction, extending in the first direction while contacting one end surface of the gate isolation structure, and connected to the second contact structure;

a conductive through-structure extending from the second surface of the substrate toward the first surface of the substrate, and connected to the buried conductive structure;

a first wiring structure having a first wiring layer connecting the first contact structure and the buried conductive structure; and a second wiring structure disposed on the second surface of the substrate, and having a second wiring layer connected to the conductive through-structure, wherein the buried conductive structure has a width in the second direction that is greater than a width of the gate isolation structure in the second direction.

18. The semiconductor device of claim 17, wherein a length of the buried conductive structure in the first direction is less than a length of the second fin-type active pattern in the first direction.

19. The semiconductor device of claim 17, wherein the first contact structure has a first extension portion extending in the second direction, wherein the second contact structure has a second extension portion extending in the second direction and connected to the buried conductive structure, and wherein the first wiring layer comprises a metal line extending in the first direction, a first metal via connecting the metal line and the first extension portion, and a second metal via connecting the metal line and the second extension portion.

* * * * *